US011184983B2

(12) United States Patent
Gavagnin et al.

(10) Patent No.: US 11,184,983 B2
(45) Date of Patent: Nov. 23, 2021

(54) EMBEDDING KNOWN-GOOD COMPONENT BETWEEN KNOWN-GOOD COMPONENT CARRIER BLOCKS WITH LATE FORMED ELECTRIC CONNECTION STRUCTURE

(71) Applicant: AT&S Austria Technologie & Systemtechnik Aktiengesellschaft, Leoben (AT)

(72) Inventors: Marco Gavagnin, Leoben (AT); Gernot Grober, Graz (AT); Christian Vockenberger, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 57 days.

(21) Appl. No.: 16/512,557

(22) Filed: Jul. 16, 2019

(65) Prior Publication Data

US 2019/0343008 A1 Nov. 7, 2019

Related U.S. Application Data

(62) Division of application No. 15/822,427, filed on Nov. 27, 2017, now Pat. No. 10,368,448.

(30) Foreign Application Priority Data

Nov. 11, 2017 (EP) .................................... 17201226

(51) Int. Cl.
*H01L 23/48* (2006.01)
*H01L 23/52* (2006.01)
*H01L 29/40* (2006.01)
*H05K 3/32* (2006.01)
*H05K 1/18* (2006.01)
*H05K 3/46* (2006.01)
(Continued)

(52) U.S. Cl.
CPC ............. *H05K 3/32* (2013.01); *H01L 23/538* (2013.01); *H05K 1/18* (2013.01); *H05K 1/186* (2013.01); *H05K 3/4611* (2013.01); *H05K 7/02* (2013.01); *H05K 2203/061* (2013.01); *H05K 2203/162* (2013.01)

(58) Field of Classification Search
CPC .......... H05K 3/32; H05K 3/4611; H05K 1/18; H05K 1/186; H05K 7/02; H05K 2203/061; H05K 2203/162; H01L 23/538
USPC ........................................................ 257/773
See application file for complete search history.

(56) References Cited

U.S. PATENT DOCUMENTS

| 8,482,117 B2 | 7/2013 | Kobayashi et al. |
| 2004/0159933 A1 | 8/2004 | Sunohara et al. |
| 2007/0096292 A1 | 5/2007 | Machida |

(Continued)

FOREIGN PATENT DOCUMENTS

| EP | 3 104 408 A2 | 12/2016 |
| WO | 2010025231 A2 | 3/2010 |

*Primary Examiner* — Andargie M Aychillhum
(74) *Attorney, Agent, or Firm* — Robert A. Blaha; Smith Tempel Blaha LLC

(57) ABSTRACT

A method of manufacturing a component carrier, wherein the method comprises mounting a known-good component on or spaced with regard to a first known-good component carrier block, thereafter forming an electrically conductive connection structure on and/or in and/or spaced with regard to the first component carrier block, and embedding the component between the first component carrier block and a second known-good component carrier block.

16 Claims, 11 Drawing Sheets

(51) Int. Cl.
*H05K 7/02* (2006.01)
*H01L 23/538* (2006.01)

(56) References Cited

U.S. PATENT DOCUMENTS

| | | |
|---|---|---|
| 2009/0085222 A1 | 4/2009 | Yamano |
| 2009/0224851 A1* | 9/2009 | Feiertag ................ H03H 9/105 |
| | | 333/186 |
| 2010/0236817 A1 | 9/2010 | Chen et al. |
| 2011/0309523 A1 | 12/2011 | Takahashi |
| 2012/0013021 A1 | 1/2012 | Kobayashi et al. |
| 2015/0221570 A1 | 8/2015 | Berry et al. |
| 2016/0066417 A1* | 3/2016 | Sugiyama ............. H01L 23/142 |
| | | 361/760 |
| 2016/0118333 A1 | 4/2016 | Lin |
| 2017/0025386 A1 | 1/2017 | Miki |
| 2017/0135219 A1 | 5/2017 | Hsu et al. |

* cited by examiner

EMBEDDING KNOWN-GOOD COMPONENT BETWEEN KNOWN-GOOD COMPONENT CARRIER BLOCKS WITH LATE FORMED ELECTRIC CONNECTION STRUCTURE

CROSS-REFERENCE TO RELATED APPLICATIONS

This application is a divisional application of U.S. patent application Ser. No. 15/822,427, filed on Nov. 27, 2017, which application claims the benefit of the filing date of European Patent Application No. 17 201 226.2 filed Nov. 11, 2017, the disclosures of both patent applications are hereby incorporated by reference.

TECHNICAL FIELD

The invention relates to a method of manufacturing a component carrier, to a method of manufacturing a system, to a component carrier, and to a system.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation also becomes an increasing issue. At the same time, component carriers shall be mechanically robust and electrically reliable so as to be operable even under harsh conditions.

Moreover, efficiently and reliably embedding a component in a component carrier is an issue. This is in particular important when valuable components, such as a microprocessor chip, are to be connected electrically with other constituents of a component carrier.

SUMMARY

There may be a need to reliably embed a component in a component carrier.

According to an exemplary embodiment of the invention, a method of manufacturing a component carrier is provided, wherein the method comprises mounting a known-good component on or spaced with regard to a first known-good component carrier block, thereafter forming an electrically conductive connection structure on and/or in and/or spaced with regard to the first component carrier block, and embedding the component between the first component carrier block and a second known-good component carrier block.

According to another exemplary embodiment of the invention, a method of manufacturing a system is provided, wherein the method comprises manufacturing a plurality of component carriers by a method having the above mentioned features, testing as to whether the individual component carriers meet at least one predefined quality criterion, so that the respective component carrier is classified as known-good component carrier, or is not classified as known-good component carrier, and thereafter assembling, in particular stacking, a plurality of component carriers which have been classified as known-good component carriers to form the system.

According to still another exemplary embodiment of the invention, a component carrier is provided, wherein the component carrier comprises a first known-good component carrier block, a known-good component mounted on or spaced with regard to the first component carrier block, an electrically conductive connection structure formed on and/ or in and/or spaced with regard to the first component carrier block after the mounting, and a second known-good component carrier block, wherein the component is embedded between the first component carrier block and the second component carrier block.

According to yet another exemplary embodiment of the invention, a system is provided which comprises a plurality of assembled, in particular stacked, known-good component carriers having the above-mentioned features.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "known-good" may particularly denote that a structure (such as a component carrier block, a cavity, a component or a component carrier) being considered for manufacturing a component carrier or a system of multiple component carriers has already previously, i.e. before using, mounting or assembling the respective constituent, been successfully tested concerning its qualification to contribute to the formation of a failure-free component carrier or system and has therefore successfully passed such a test. In particular, such a test may be a quality test testing this qualification. The quality test may test as to whether the respective structure fulfills a predefined specification, is within a predefined range of tolerances, and/or complies with a predefined functional requirement. Such a quality test may be an electric test which may for instance involve applying an electric stimulus signal and measuring an electric response signal which must fulfill certain conditions in order to consider the respective structure to have passed the test. Such a test may, additionally or alternatively, be also an inspection (for instance an optical inspection) measuring shape and/or dimension of a respective structure as at least part of the test. In an embodiment, only if an individually tested structure has passed the test, it is classified as "known-good" structure, whereas it can be classified as "not known-good" if the structure fails to pass the test. Upon failing such a test, the respective structure may for instance be disposed as waste, or may be made subject to a repair or post-processing procedure or may be used for another purpose.

In the context of the present application, the term "electrically conductive connection structure" may particularly denote any two- or three-dimensional arrangement of electrically conductive bodies being configured for providing an electric coupling of the component with a respective one of the component carrier blocks, with other portions of the component carrier and/or with an electronic environment, and/or to provide an electric coupling between the component carrier blocks. Such an electrically conductive connection structures may be composed of one or more patterned electrically conductive layers (such as a patterned copper foil), vertical interconnect structures (such as copper filled laser vias or copper filled mechanically drilled holes), etc.

In the context of the present application, the term "component" may particularly denote any body, in particular having an electronic and/or thermal and/or mechanical function, being embedded in or surface-mounted on the component carrier block or component carrier. In particular, the component may be of a non-layer type, i.e. may not be as flat as the layer structures forming the stack. For instance, the component may extend vertically over multiple layer structures of the stack. In embodiments, the component may be made of a material at least partially deviating from component carrier material. For example, the component may be a semiconductor chip.

In the context of the present application, the term "component carrier block" may particularly denote a body comprising or consisting of component carrier material, in particular fully cured component carrier material. Such a component carrier block may be a layer stack composed of at least one electrically conductive layer structure (for instance comprising or consisting of copper) and/or at least one electrically insulating layer structure (for instance comprising or consisting of a resin such as an epoxy resin, optionally comprising reinforcing particles such as glass fibers) being connected to one another, in particular by lamination. For example, the respective component carrier block may already be considered as a component carrier such as a PCB (printed circuit board) or an IC (integrated circuit) substrate at the very beginning of the manufacturing procedure. Already when brought in contact with the component during the embedding procedure, the respective component carrier block may be already fully cured.

In the context of the present application, the term "layer stack" may particularly denote a stack of multiple planar layer structures being connected to one another. In particular, such layer structures may be electrically insulating layer structures and/or electrically conductive layer structures. The term "layer structure" may particularly denote one of a continuous layer, a patterned layer and an arrangement of multiple connected and/or non-connected islands within one plane. For instance, such a layer structure may be a continuous foil or sheet, whereas such a foil or sheet may also be patterned. The layer structures or the stack as a whole may comprise component carrier material, i.e. material used for electrically conductive structures or electrically insulating structures of a component carrier such as a printed circuit board or an IC substrate. The individual layer structures of the stack may be connected in particular by lamination, i.e. the application of heat and/or pressure.

According to an exemplary embodiment of the invention, a manufacturing architecture for manufacturing a component carrier is provided in which a component carrier with embedded component is formed using known-good component carrier blocks and a known-good component. By combining individually pre-tested known-good structures during manufacture of the component carrier or system, it can be ensured that the manufactured component carrier or system reliably meets predefined quality criteria and is compliant with a certain specification for a component carrier being manufactured. This is in particular advantageous when complex and/or valuable and/or not easily available constituents of a component carrier are combined during the manufacture of the component carrier. For instance, the component may be a microprocessor to form a component carrier with integrated or embedded microprocessor function. If one of the component carrier blocks and the component itself being used for embedding the microprocessor should not meet certain quality requirements, the readily manufactured component carrier would have to be classified as waste and the remaining, for instance good, structures thereof would be lost. This would result in a significant loss of hardware and manufacturing resources. By ensuring that the combined structures are all known-good as a result of a corresponding test carried out prior to the assembly of the respective structure during the manufacturing process of the component carrier, resources may be used efficiently.

Highly advantageously, a manufacturing architecture is provided in which a known-good first component carrier block (which may already be a fully cured core or even a component carrier body such as a PCB or an IC substrate) and a known-good second component carrier block (which may already be a fully cured core or even a component carrier body such as a PCB or an IC substrate) sandwich a previously successfully tested known-good component (such as a semiconductor chip) in between them, wherein an electrically conductive connection structure for establishing an electric contact between two or all three of the two component carrier blocks and the component may be formed only after having attached the component to at least one of the component carrier blocks. Embedding a component can therefore be carried out implementing a component-middle (in particular a chip-middle) technology, i.e. positioning the component in the middle of the build-up. This allows obtaining a high yield, further promoted by the use of known-good, i.e. previously successfully tested, devices for manufacturing the component carrier. Also, a proper signal propagation can be obtained by this manufacturing architecture. By forming at least part of the electrically conductive connection structure after initial coupling of at least one of the component carrier blocks and the component, it may be possible to use a single material (such as copper) for establishing the electric interconnection within the component carrier, in particular advantageously avoiding any undesired intermetallic interface.

In the following, further exemplary embodiments of the methods, the component carrier, and the system will be explained.

In an embodiment, the method comprises providing at least one of the first component carrier block and the second component carrier block or at least one recessed layer in between with a cavity, in particular a known-good cavity, and mounting the component in the cavity. A respective one of the component carrier blocks or a separate patterned or cut out layer structure may comprise one or more recesses corresponding to a size of the one or more components defining the cavity. If the cavity is tested before assembly of the component, it can be ensured that the cavity is a known-good cavity, thereby further increasing the yield of the readily manufactured component carriers. For instance, a cavity may pass a corresponding quality test if dimensions and/or a shape of the cavity are/is within a respective predefined corridor of acceptable values. For instance, the test may include a detection of shape and/or dimension of the cavity, for instance its deviation from a rectangular cross-section or the width of the cavity. Additionally or alternatively, accessibility of an electrically conductive surface may be tested for the cavity.

In an embodiment, the method comprises stacking a plurality of known-good component carriers manufactured according to the above described method on top of one another. By taking this measure, even complex systems with sophisticated electronic functionality may be easily formed without the risk that such a complex system lacks functionality due to quality issues with constituents thereof.

In an embodiment, the method comprises, prior to the mounting, testing (in particular electrically testing) the first component carrier block, the second component carrier block and the component (in particular individually) for compliance with at least one quality criterion (which may be different for the component carrier blocks and the component), and classifying the first component carrier block, the second component carrier block, and the component (in particular individually) as a known-good first component carrier block, a known-good second component carrier block, and a known-good component, respectively, only if the tested first component carrier block, second component carrier block, and component, respectively, meets the at least one quality criterion. Such a classification of a respective structure (i.e. first component carrier block, second component carrier block, and component) as "known-good" may be made only if the tested component carrier block or component meets the at least one assigned quality criterion. Otherwise, it is for instance possible to reject the tested first component carrier block, second component carrier block, and component, respectively, as waste.

What concerns the first and the second component carrier block, the shape and/or dimension of the respective component carrier block may be tested, for instance by optical inspection. Additionally or alternatively, the electric functionality of the respective component carrier block may be tested, for instance by the application of at least one electric stimulus signal and by the measurement of a corresponding response signal which must for instance fulfill certain conditions (for instance must be within a respective corridor) to allow the respective component carrier block passing the electronic test.

What concerns the component, the test may be an inspection (for instance by optically monitoring) of shape and/or dimensions of the component. However, it is also possible that the component is tested, additionally or alternatively, in accordance with an electric functioning test, for instance a chip test.

In an embodiment, the method comprises forming the electrically conductive connection structure so as to establish an electrically conductive coupling between at least two of the group consisting of the first component carrier block, the second component carrier block, and the component by the electrically conductive connection structure. In particular, the method may comprise forming an electrically conductive connection between the component and the first component carrier block by the electrically conductive connection structure. However, the electrically conductive connection structure may also form, additionally or alternatively, an electrically conductive connection between the first component carrier block and the second component carrier block and/or between the second component carrier block and the component.

In an embodiment, the method comprises forming at least one of the first component carrier block and the second component carrier block by connecting (in particular by laminating) at least one electrically conductive layer structure and at least one electrically insulating layer structure. An integral connection between electrically insulating layer structures and electrically conductive layer structures may therefore be established by lamination, i.e. the application of heat and/or pressure. In this context, it may be advantageous to form at least part of the electrically insulating layer structures from a material being at least partially uncured prior to the lamination. In the context of the present application, the term "at least partially uncured material" particularly denotes material which has the property to at least partially melt or become flowable by the application of elevated pressure and/or elevated temperature, and become fully hardened or cured (and thereby becomes solid) when releasing the applied elevated pressure and/or elevated temperature. Consequently, applying elevated pressure and/or elevated temperature may cause melting of the curable or at least partially uncured material, followed by an irreversible hardening upon releasing the applied high pressure and/or high temperature. In particular, the "at least partially uncured material" may comprise or consist of B-stage material and/or A-stage material. By providing a respective layer structure from resin, prepreg or any other B-stage material, the layer structure may re-melt during lamination so that resin (or the like) may flow for interconnecting the various elements and for closing gaps or voids and may therefore contribute to a stable intrinsic interconnection within the component carrier being manufactured. During lamination, material (such as resin) of the respective electrically insulating layer structure may therefore become flowable or melt, may flow into gaps during cross-linking, and may then re-solidify to thereby form an integral connection between the layer structures.

In an embodiment, the method comprises forming the electrically conductive connection structure for providing an electric coupling both within a plane corresponding to a respective layer of the component carrier blocks and perpendicular to the plane, i.e. three-dimensionally. Thus, the electrically conductive connection structure may provide electrically conductive traces or bodies both within a respective plane of a respective layer structure of the respective component carrier block, and perpendicular thereto. By taking this measure, even complex electric connection tasks may be fulfilled by the electrically conductive connection structure.

In an embodiment, the method comprising forming a plurality of component carriers according to the above described method simultaneously on a panel (i.e. on panel level), and subsequently singularizing the panel to thereby form the plurality of separate component carriers. By manufacturing the component carriers on panel level rather than individually, an efficient batch procedure may be carried out. In other words, the individual component carriers may be manufactured while still being integrally connected on the panel. For example, such a panel may have a size of 12×18 square inches. When manufacturing component carriers with embedded components on panel level, it is of particular advantage to use only known-good structures for this purpose in order to keep the hardware and manufacturing effort as low as possible and increase the yield of the manufacturing process. Singularization may be carried out by separating the obtained processed panel into respective sections each of which comprising part of the two opposing component carrier blocks including at least one cavity, and at least one embedded component. For example, singularization may be carried out by laser separation, etching or mechanically sawing the processed panel into the individual component carriers.

In an embodiment, the method comprises testing on panel level (in particular electrically testing) a first common component carrier block, a second common component carrier block, and a plurality of components for compliance with at least one quality criterion, and classifying the first common component carrier block, the second common component carrier block, and the individual components as a known-good first common component carrier block, a known-good second common component carrier block, and a known-good component, respectively, only if the tested first common component carrier block, second common component carrier block, and respective component, respectively, meets at least one quality criterion. Otherwise, the tested first common component carrier block, second common component carrier block, or respective component may be disregarded or not used for manufacturing the component carriers. Testing the component carrier blocks already on panel level rather than on component carrier level may ensure that valuable components such as microprocessors are embedded only in intact cavities of an intact portion of a respective component carrier block of the panel. Thus, the yield may be increased and resources may be used efficiently.

In an embodiment, the method further comprises testing (in particular electrically testing) a plurality of component carriers manufactured according to the above described method, classifying a respective one of the component carriers as known-good component carrier only if the tested respective component carrier meets the at least one quality criterion, otherwise rejecting the respective component carrier, and assembling a system composed of a plurality of component carriers classified as known-good component carriers only. By also testing the manufactured component carriers for compliance with one or more quality criteria prior to connecting several of such component carriers to form a module or system, an even more efficient use of hardware and manufacturing resources may be ensured. In other words, it is highly advantageous to carry out a product test not only on the level of the readily manufactured system, but already on component carrier level.

In an embodiment, the method comprises forming multiple component carriers simultaneously on two opposing main surfaces of a temporary carrier. Using both opposing main surfaces of a temporary carrier for manufacturing component carriers, in particular on panel level, increases the yield and the efficiency of the manufacturing process. In this context, a temporary carrier may be a carrier providing mechanical support during manufacture but not forming part of the readily manufactured component carriers. In contrast to this, a temporary carrier may be disposed, reused or sacrificed during the manufacturing process. For instance, such a temporary carrier may be a core of fully cured component carrier material (such as FR4), a sticky tape, etc.

In an embodiment, at least one of the first component carrier block and the second component carrier block comprises or consists of fully cured material at the time of mounting the component, in particular at the time of embedding the component between the first component carrier block and the second component carrier block. For instance, the respective component carrier block may comprise a fully cured and hardened dielectric material (such as resin with glass fibers, for instance FR4), and may also comprise electrically conductive structures (preferably made of copper). When being already fully cured (i.e. not being at least partially uncured), the respective component carrier block may already be rigid and stiff and may provide mechanical support.

In an embodiment, the method comprises electrically connecting at least two of the first component carrier block, the second component carrier block, and the component by the electrically conductive connection structure without material interface between different materials, in particular by thermal compression bonding. The electric coupling between (in particular copper structures of) at least two of the three mentioned constituents may therefore be accomplished without additional different connecting material (such as solder which may be based on tin) in between. For instance, this may be accomplished advantageously by thermal compression bonding. The term "thermal compression bonding" or "thermocompression bonding" may in particular denote a bonding technique implementing diffusion bonding, pressure joining, thermocompression welding or solid-state welding. More specifically, two metallic bodies (such as a pad of the component and an exposed area of the electrically conductive connection structure and/or of the component carrier bodies), for instance both comprising or consisting of copper, may be brought into atomic contact by applying force and heat simultaneously to thereby form a connection without a bridge between different materials. Without wishing to be bound to a specific theory, it is presently believed that, as a result of an atomic contact between the surfaces, atoms may migrate from one body to the other one sticking the interface together. For instance, a copper-copper connection may be formed at the interface between electrically conductive connection structure and one or more electric contacts of the component. A different material, such as a solder paste or the like, bridging the electrically conductive connection structure and the electric contact of the component or a respective component carrier body may then be advantageously omitted. This prevents undesired effects such as a contact resistance or a mechanical weak point which may suffer from thermal load generated due to different coefficients of thermal expansions of different materials at this interface.

In other embodiments, it is however possible to provide such additional materials between electric contact of the component and electrically conductive connection structure and respective component carrier body, for instance a solder.

In an embodiment, the method comprises surface mounting at least one further component, in particular at least one further known-good component, on an exterior main surface of the component carrier. In particular, this surface mounting of the one or more further components may be done on an exterior main surface of the first component carrier block and/or the second component carrier block. Therefore, a module-type or package-type component carrier may be provided having a complex electronic functionality. By the preferred use of a known-good component, i.e. a component which has been previously successfully tested concerning at least one quality criterion before surface mounting, it can be ensured that the yield of the component carrier as a whole is high.

In an embodiment, mounting the component on or spaced with regard to the first component carrier block comprises arranging the component on a temporary carrier, thereafter laminating the first component carrier block with the component on the temporary carrier, and subsequently removing the temporary carrier. For instance, the one or more components may be arranged on a sticky foil as temporary carrier, at least one (for instance partially pre-cut) uncured dielectric layer structure (for instance an uncured resin sheet or a prepreg sheet) may be placed on the temporary carrier with attached components(s), and the (in particular previously fully cured) first component carrier block may be placed on top. The mentioned constituents may then be connected by lamination.

In an embodiment, forming the electrically conductive connection structure comprises forming at least one vertical interconnect, in particular at least one copper filled laser via. The formation of vertical through connections surrounded by dielectric material may reliably prevent co-planarity issues which may be involved with the formation of protruding pillars.

In an embodiment, forming the electrically conductive connection structure comprises attaching and patterning an electrically conductive foil. By taking this measure, also electrically conductive traces within one plane can be established in accordance with a certain electronic application.

The patterned electrically conductive foil(s) may be (in particular directly) electrically coupled with the vertical interconnect(s) to thereby establish a three-dimensional electric coupling structure.

In an embodiment, embedding comprises attaching the second component carrier block to an arrangement comprising the first component carrier block, the component and the electrically conductive connection structure. The arrangement may be pre-connected (for instance by lamination) prior to attaching the second component carrier block.

In an embodiment, forming the electrically conductive connection structure comprises forming a component-external redistribution layer between the component and the second component carrier block. Correspondingly, the component (in particular a semiconductor chip) may be free of a component-internal redistribution layer and is electrically coupled with the component-external redistribution layer of a respective one of the component carrier blocks and/or material in between. By taking this measure, a redistribution layer may be formed on the level of component carrier material rather than on the level of the component. A redistribution layer may be denoted as a partially electrically conductive and partially dielectric layer structure translating electrically between the small dimensions of the semiconductor world (i.e. the small dimensions of contacts and distances between contacts of the component which may be a semiconductor chip) and the larger dimensions of the component carrier world (such as larger dimensions of electrically conductive traces and distances between adjacent conductive trace elements of a component carrier such as a printed circuit board). Forming a redistribution layer on component carrier level rather than on chip level may simplify the procedure.

In an embodiment, the method comprises providing at least one at least partially uncured electrically insulating layer structure between the first component carrier block and the second component carrier block and curing the at least one at least partially uncured electrically insulating layer structure to thereby establish an integral connection between the first component carrier block and the second component carrier block. For instance, the at least one at least partially uncured electrically insulating layer structure may comprise one pre-cut layer of uncured material and having at least one through hole as cavity, and may additionally comprise one complete layer of uncured material. The one or more components may be arranged in the one or more through holes of the pre-cut layer, and the uncured complete layer may be placed between the second component carrier block on the one hand and the first component carrier block with pre-cut layer and component(s) on the other hand. This arrangement may then be interconnected.

In an embodiment, the method comprises mounting the component directly on the first component carrier block or indirectly via at least one intermediate layer structure on the first component carrier block. In particular, the method may provide an intermediate layer structure at least partially accommodating the component and arranged between the first component carrier block and the second component carrier block. For example, the at least one intermediate layer structure may be the previously mentioned at least one at least partially uncured electrically insulating layer structure.

In an embodiment, the method comprises partially or fully encapsulating the component by an encapsulant on the first component carrier block prior to connecting the second component carrier block to the partially or fully encapsulated component. For instance, such an encapsulant may be made on the basis of resin (in particular liquid resin being hardened during the encapsulation).

The at least one component can be selected from a group consisting of an electrically non-conductive inlay, an electrically conductive inlay (such as a metal inlay, preferably comprising copper or aluminum), a heat transfer unit (for example a heat pipe), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guiding element (for example an optical waveguide or a light conductor connection), and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite base structure) or may be a paramagnetic element. However, the component may also be a further component carrier, for example in a board-in-board configuration. The component may be surface mounted on the component carrier and/or may be embedded in an interior thereof. Moreover, also other components may be used as component.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminate-type body. In such an embodiment, the semi-finished product or the component carrier is a compound of multiple layer structures which are stacked and connected together by applying a pressing force, if desired accompanied by heat.

BRIEF DESCRIPTION OF THE DRAWINGS

The aspects defined above and further aspects of the invention are apparent from the examples of embodiment to be described hereinafter and are explained with reference to these examples of embodiment.

DETAILED DESCRIPTION OF EXEMPLARY EMBODIMENTS

Figure 1:
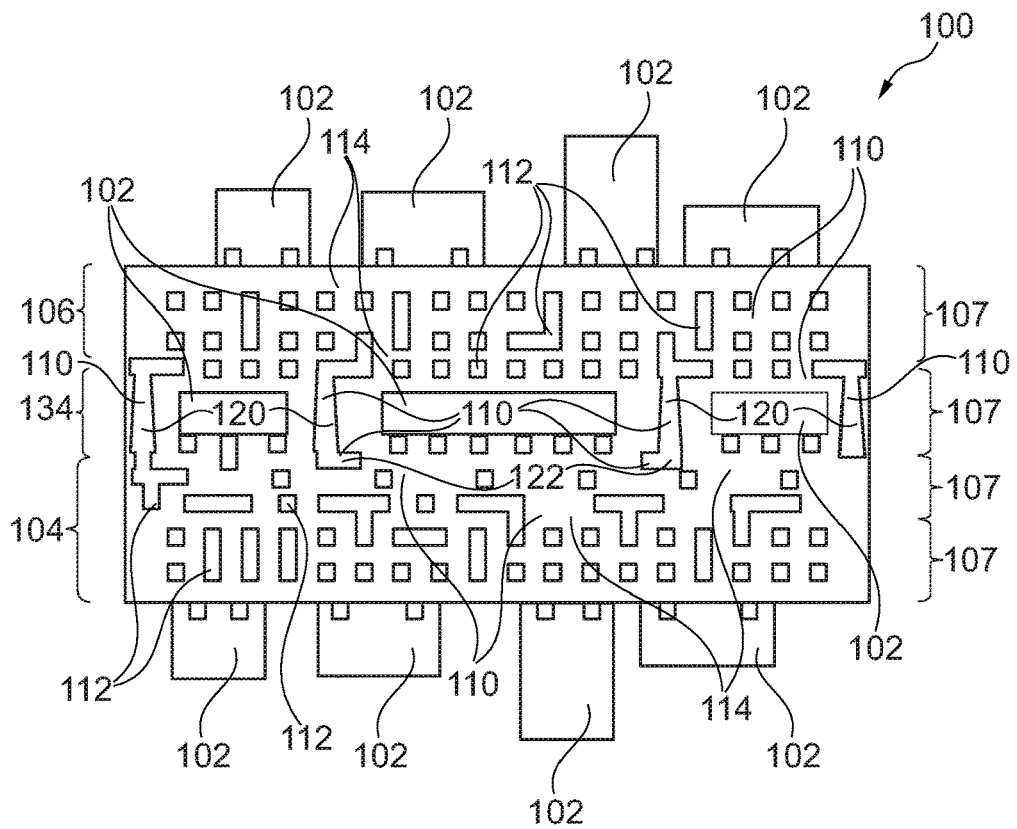
FIG. 1 illustrates a cross-sectional view of a component carrier obtained during carrying out a method of manufacturing a component carrier according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a method of producing a three-dimensional component carrier (in particular a semiconductor package based on lamination technology) may be provided. Such a manufacturing architecture allows achieving a high-density three-dimensional component carrier (in particular semiconductor) package, in which the high complex and valuable components are integrated as late as possible within the package or component carrier. Furthermore, the manufacturing method provides a high degree of flexibility, and the package uses a modular approach. Such a modular approach may here denote a separate production of building blocks (in particular component carrier blocks, component) within this package-type component carrier and a re-combination of known-good electronic blocks (in particular successfully electrically tested and being fully functional components)

forming the full package-type component carrier, and/or electronic system(s) which may be combined to a three-dimensional (in particular semiconductor) package-type component carrier. Thus, the gist of combining known-good constituents only allows a cost effective manufacture of a three-dimensional package-type component carrier of different constituents, like digital ones with analog ones.

The connection of the known-good electronic blocks can be done using thermal compression bonding, soldering, any desired surface mount technology (such as direct chip attach, reflow soldering, use of an Anisotropic Conductive Film (ACF) or an Anisotropic Conductive Paste (ACP)). One other possibility is to add technologies for z-axis connections as package-to-board connection.

It should also be mentioned that additional insulating material can be connected to the component carrier as well in order to receive an even more reliable device. This can be done for example by attaching glue or a prefabricated (for instance B-stage) insulating layer structure or other material for connecting between the two component carrier blocks. Thus, a hermetically sealed system can be received.

By forming and connecting at least part of the electrically conductive connection structure only after having coupled the component with the first component carrier block, an improved signal integrity may be obtained. By providing metal-filled vias rather than pillars for electrically contacting purposes, there are no issues with co-planarity.

In embodiments, the integration of one or more components in a component carrier or system to be manufactured may be carried out as late as possible. In order to achieve this, known-good electronic blocks may be advantageously implemented. More specifically, component carrier blocks (such as PCB blocks, IC substrate blocks), components, etc., may be re-combined using component carrier-compatible processes to form the full component carrier and electronic system. In particular, known-good may indicate that the full electrical functionality of the electronic blocks may be proved before assembling them together. The assembly of known-good electronic blocks may allow at least partially overcoming yield issues while forming electrical layers on components of high value or costs (for instance a processor).

An exemplary embodiment of the invention furthermore allows forming high-density interconnections in all spatial directions (i.e. three-dimensionally).

Furthermore, implementing pre-manufactured PCB or IC substrate type component carrier blocks with which the component(s) is/are encapsulated, may allow reducing warpage issues with the manufactured component carrier and system, which may be conventionally especially critical during the formation of re-distribution layers of the component in terms of fan-out packaging.

In exemplary embodiments, die shift compensation may be achieved by:

having the component contacts exposed for registration, fixed and electrically contacted on an electrically conductive layer structure such as a copper foil; and/or assembly on a known-good component carrier block (such as a PCB or an IC substrate) before encapsulation; and/or fixing the component(s) on a heat spreading layer and register the component position before encapsulation.

A system manufactured according to an exemplary embodiment of the invention may be used as an all-in-one-package, for instance for use in a smartphone. However, electronic modules in general and being manufactured in component carrier technology can be targeted with methods according to exemplary embodiments of the invention described hereby.

According to one embodiment of the invention, a prefabricated board or component carrier body may be provided with embedded components, wherein the connection of the prefabricated board to the opposite surface of the structure may be accomplished with metal filled vias. According to another embodiment of the invention, the previously described embodiments may be carried out using (in particular only) known-good elements. According to still another exemplary embodiment, the previously described semi-finished component carrier or system can be configured so that on the opposite surface of the structure, further build-up layers or another prefabricated board or component carrier body may be implemented.

FIG. 1 illustrates a cross-sectional view of a component carrier 100 obtained during carrying out a method of manufacturing a component carrier 100 according to an exemplary embodiment of the invention.

The component carrier 100 according to FIG. 1, which is here embodied as a flat plate-shaped printed circuit board (PCB), comprises a laminated first known-good component carrier block 104 (which optionally may comprise one or more embedded components, not shown), a second known-good component carrier block 106 (which optionally may comprise one or more embedded components, not shown) and an intermediate layer structure 134 comprising an electrically conductive connection structure 110 functioning as redistribution layer structure 189. Known-good components 102, for instance semiconductor chips which have already passed a quality test before embedding, are mounted within the intermediate layer structure 134 and are electrically coupled by the electrically conductive connection structure 110. The components 102 may be active components or passive components. The components 102 are embedded between the first component carrier block 104 and the second component carrier block 106.

The component carrier 100 comprises electrically conductive layer structures 112 which includes the electrically conductive connection structure 110 and may for instance comprise or consist of copper. Each of the first component carrier block 104 and the second component carrier block 106 moreover comprises a respective plurality of electrically insulating layer structures 114 which may be composed of cured resin (such as epoxy resin) and optionally reinforcing particles (such as glass fibers) therein (for instance may be FR4 material). A suitable material for insulating layers without glass fibers may be epoxy-based build-up film (for instance ABF-Material). Ajinomoto build-up films (ABF) may be used as insulating layers for packaging substrates due to their features of good reliability, excellent processability and well-balanced properties. Appropriate ABF for mass-production are halogen-free GX series that show high glass transition temperature (Tg) and good insulation reliability, and specifically they are designed to be etched by alkaline permanganate solution (desmear process) to form micro anchors on the resin surface for its high adhesion with plated copper. For forming the first component carrier block 104 and the second component carrier block 106, respective layer structures 112, 114 have been connected by lamination, i.e. the application of pressure and/or heat. Previously at least partially uncured material (for instance uncured resin or prepreg) of the electrically insulating layer structures 114 may be rendered flowable by the application of heat and/or pressure, will consequently start cross-linking and will then re-solidify, thereby integrally connecting the constituents of the respective component carrier block 104, 106.

During the process of manufacturing the component carrier 100 shown in FIG. 1, one or more further components 102 may be surface mounted on an exterior surface of the component carrier 100.

Advantageously, it is possible to electrically couple the embedded known-good components 102 during manufacturing with the only later (i.e. after mounting the components 102 to be embedded) formed electrically conductive connection structure 110 so as to establish an electrically conductive coupling between the embedded components 102 and the electrically conductive connection structure 110 and from there with the component carrier blocks 104, 106.

As can be taken from FIG. 1, the electrically conductive connection structure 110 which is here integrated in the intermediate layer structure 134 is foreseen for providing an electric coupling both within (see the horizontal plane in FIG. 1) and perpendicular to (see the vertical direction of FIG. 1) a plane corresponding to a respective layer of the layer stack of the component carrier 100. This renders even complex electric coupling tasks feasible. Descriptively speaking, the electrically conductive connection structure 110 of the intermediate layer structure 134 may constitute a component-external redistribution layer spatially widening up smaller electric coupling dimensions of the chip-type components 102 to the larger electric coupling dimensions of the PCB-type component carrier blocks 104, 106. Correspondingly, the semiconductor chip-type components 102 may be provided free of a component-internal redistribution layer and are electrically coupled with the component-external redistribution layer which may be provided by the component carrier blocks 104, 106 and/or the electrically conductive connection structure 110.

Advantageously, the known-good components 102 may be electrically coupled with the electrically conductive connection structure 110 without material interface at a connection position. In other words, a direct copper-copper bond may be established without any other material therebetween at a mechanical interface between the electrically conductive connection structure 110 and a pad of the (for instance chip-type) components 102.

Furthermore, electric interconnections in z-direction (i.e. the vertical direction according to FIG. 1) may be constituted by a multi-layer structure composed of both z- and xy-interconnections (see electrically conductive connection structure 110 and electrically conductive layer structures 112, respectively). This peculiarity allows fanning-out the interconnections from the embedded components 102 to the components 102 on top of the component carrier 100 not only in the redistribution layer (RDL) provided by the electrically conductive layer structure 110, but also along the z-axis. This architecture may allow the reduction of the overall system dimension in all three dimensions, i.e. less RDLs below the embedded components 102 and on top of the package-type component carrier 100.

Figure 35:
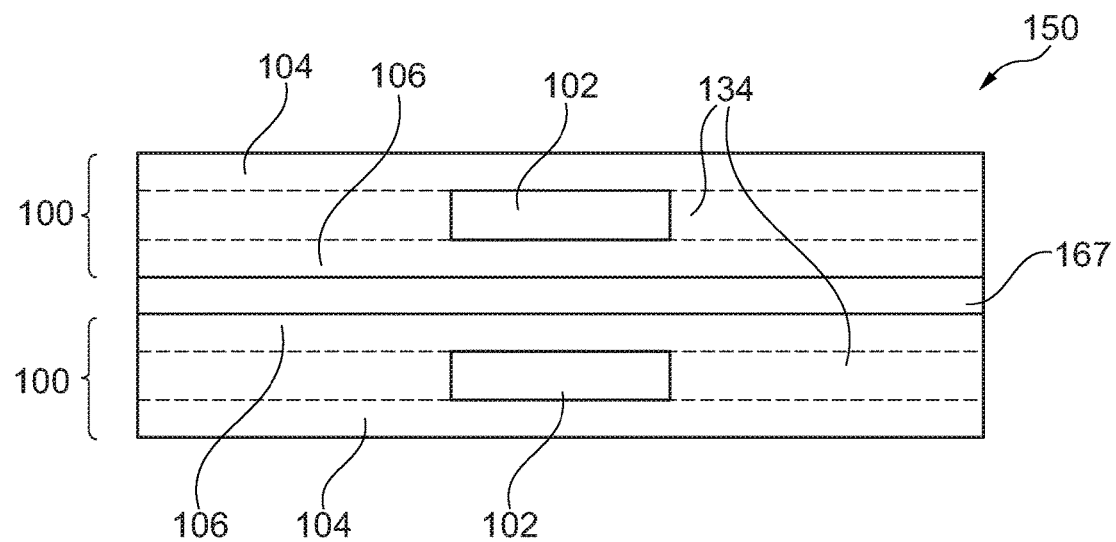
FIG. 35 illustrates a cross-sectional view of a system composed of two stacked and electrically as well as mechanically interconnected component carriers obtained by carrying out a method of manufacturing the component carriers and the system according to an exemplary embodiment of the invention.

The component carrier 100 of FIG. 1 may be properly appropriate to be used as a modular constituent of a larger system 150 in which the component carrier 100 is stacked with one or more further components 102 (as shown in FIG. 1) and/or being stacked with at least one further component carrier 100 (see FIG. 35).

The three-dimensional semiconductor package in form of the laminated type component carrier 100 of FIG. 1 may be composed of four stacked electronic blocks 107 (composed, in turn, of component carrier blocks 104, 106 and intermediate structure 134 with embedded components 102), in combination with surface mounted components 102 on both opposing main surfaces of the electronic blocks 107.

The three-dimensional semiconductor package in form of component carrier 100 may include an assembly of highly complex and valuable components 102 being mounted as late as possible in the manufacturing process, by combining pre-fabricated and pre-tested known-good devices (see reference numerals 104, 106, 102). Such an embodiment can be denoted as an evolution from a "Package on Package" architecture to a "System on System" architecture.

A component carrier 100 and system 150 according to exemplary embodiments of the invention may be obtained by integrating different functional constituents together. For instance, the component carrier 100 or system 150 may be digital oriented, configured in accordance with another radio frequency, may be power management oriented, all independent and fully functional before re-combination of multiple known-good devices. Once they are combined together, the component carrier 100 shown in FIG. 1 or the system 150 shown in FIG. 35 is obtained by a modular technology.

Figure 2:
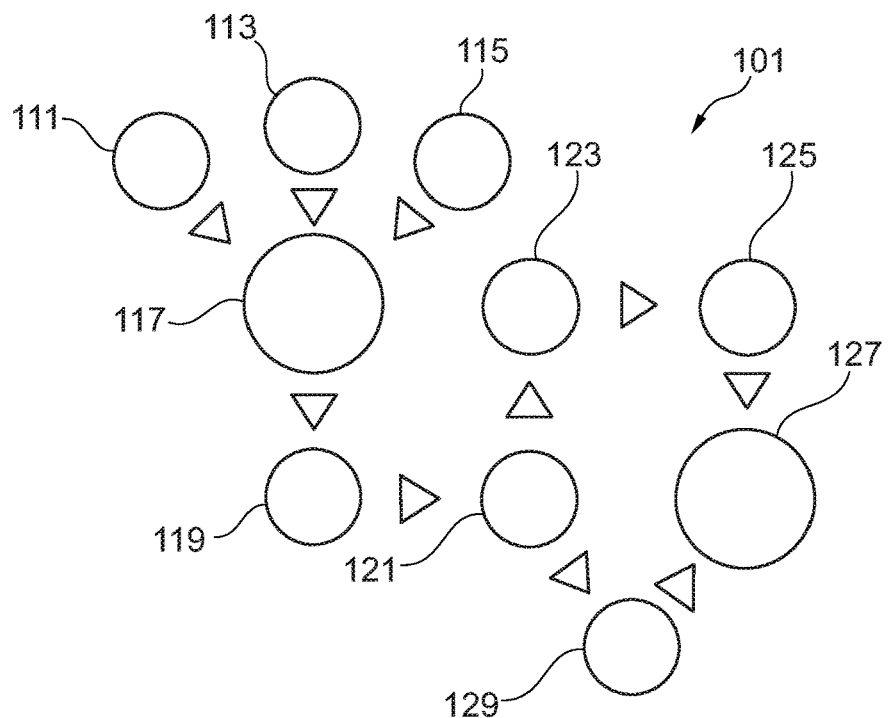
FIG. 2, FIG. 3 and FIG. 4 illustrate flowcharts of procedures to be carried out according to a method of manufacturing a component carrier according to an exemplary embodiment of the invention.
Figure 3:
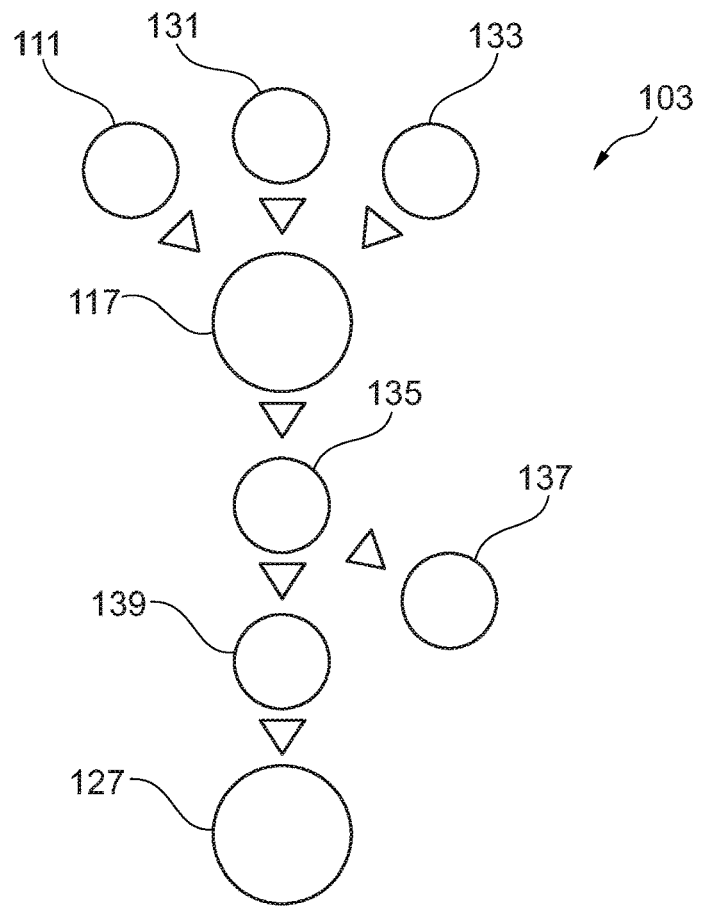
Figure 4:
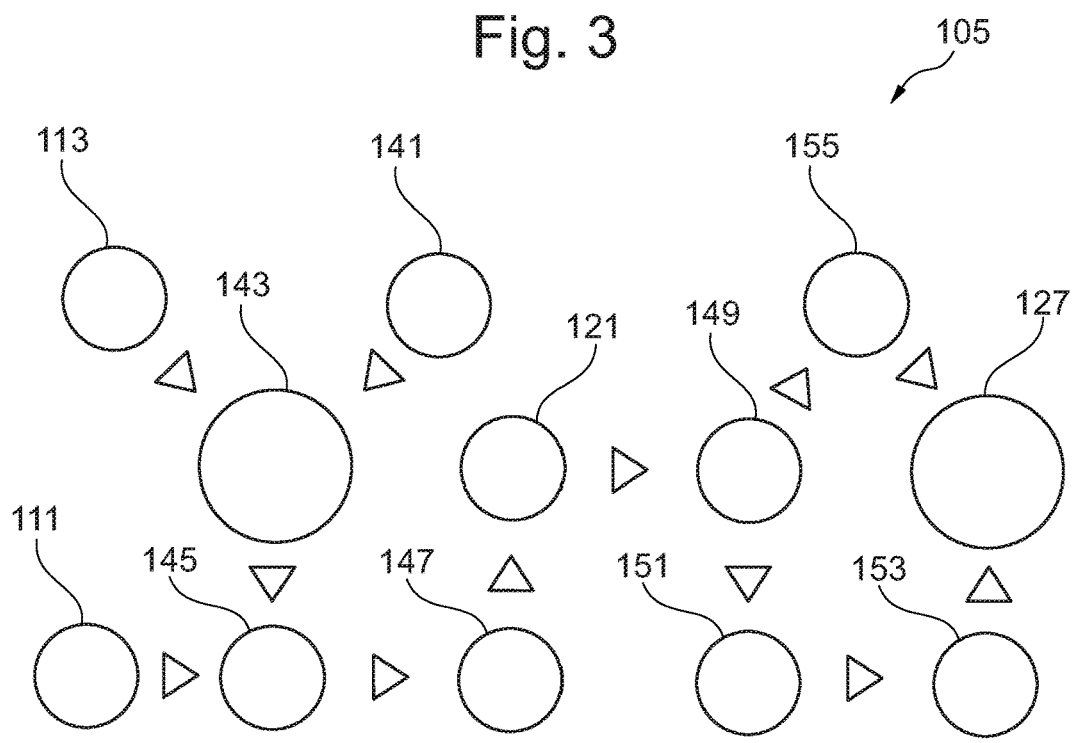

Methods of producing a component carrier 100 and a system 150 according to exemplary embodiments of the invention will be described in the following in further detail:

FIG. 2, FIG. 3 and FIG. 4 illustrate flowcharts 101, 103, 105, respectively of procedures to be carried out according to a method of manufacturing a component carrier 100 according to an exemplary embodiment of the invention.

Referring to FIG. 2, flowchart 101 illustrates encapsulation with top part of the package type component carrier 100 (see for example FIG. 5 to FIG. 12).

According to flowchart 101, a pre-cut prepreg (see block 111), a known-good PCB or IC substrate (see block 113) and components on a carrier (see block 115) are combined by the application of pressure and heat (see block 117). Thereafter, a carrier may be removed (see block 119). Via formation (see block 121) may then be carried out according to different options.

In one option, a redistribution layer is formed (the block 123), followed by the assembly on a known-good substrate (see block 125). In accordance with this option, formation of the redistribution layer may be accomplished directly on the encapsulated components in accordance with a "chip middle" strategy. Subsequently, a final assembly can be carried out (see block 127).

In an alternative other option, via formation (see block 121) may be followed by an assembly of a PCB or an IC substrate (see block 129). In accordance with this alternative option, the redistribution layer is assembled on the encapsulated components. This option allows creating separately the redistribution layers, test them, and uniquely those redistribution layers which are electrically fully functional will be assembled. The assembly can be executed by soldering methods (for instance reflow soldering) or thermo-compression bonding in case copper posts or pillars are present either on the PCB/substrate or on the package. In the described process flow, the redistribution layer may be formed either by a PCB or an IC substrate, allowing in the subsequent procedures the final assembly. The result of this procedure may then be made subject to final assembly (see block 127).

However, the redistribution layer can be produced in other ways in other embodiments of the invention (for instance with wafer-level processing equipment).

A different embodiment (see for example FIG. 13 to FIG. 20) uses, as a carrier, a thin copper foil on which the components are electrically connected (for instance by a thermal compression bonding method). The thin copper foil is itself supported by a carrier foil (which may be denoted as sacrificial carrier) which will later be removed. After the removal of the sacrificial carrier, the first layer may be structured and, as in the case of FIG. 2, the redistribution layer may be either formed or assembled on the encapsulated components.

Flowchart 103 in FIG. 3 describes a process according to another exemplary embodiment of the invention (see for example FIG. 21 to FIG. 27). This embodiment involves encapsulation with a bottom part of the package.

According to flowchart 103, a pre-cut prepreg (see block 111), a known-good PCB/substrate with optionally assembled or embedded components (see block 131) and a copper foil (see block 133) are combined by the application of pressure and heat (see block 117). Next, via formation and copper foil patterning are carried out (see block 135).

In a following first option (see block 137), a redistribution layer is formed on the top of the package. This is followed by block 139 indicating assembly of a further PCB or IC substrate. Then, final assembly (see block 127) can be directly carried out.

In an alternative option (see block 139), assembly of the further PCB/IC substrate is carried out directly after block 135. This is followed by final assembly (see block 127).

Within this method, instead of encapsulating the components together with the top package, the same components can be already assembled on a known-good PCB/substrate, encapsulated and subsequently, via formation and structuring of the copper foil on top can be executed. Afterwards, the redistribution layer can either be manufactured directly on the package, or pre-made and assembled on top. The assembly can be executed by soldering (for instance reflow soldering) or preferably by thermal compression bonding in case copper posts or pillars are present on the PCB/substrate or on the package. Advantageously, also this embodiment may be executed using PCB-compatible equipment/processes.

Flowchart 105 in FIG. 4 describes a process according to yet another exemplary embodiment of the invention (see for example FIG. 28 to FIG. 34). This embodiment involves encapsulation of heat sensitive components.

According to this embodiment, a known-good PCB/substrate (see block 113 and components (see block 141) are assembled on a heat conductive surface such as copper (see block 143). Temperature is increased and pressure is applied (see block 145) for interconnection with a pre-cut prepreg (see block 111). Subsequently, component contacts are exposed (see block 147). Next, vias are formed (see block 121). Subsequently, a via filling procedure and a first layer structuring is carried out (see block 149).

In a following first option, a redistribution layer is formed (see block 151), followed by an assembly on a known-good substrate (see block 153). Thereafter, a final assembly 127 may be carried out.

In an alternative option, assembly on a PCB/IC substrate occurs (see block 155), followed by the final assembly (see block 127).

The process described referring to FIG. 4 allows manufacturing a component carrier 100 or a system 150 according to an exemplary embodiment of the invention based on components 102 needing heat dissipation. In such an embodiment, it is possible to attach (for instance using die attaching technology or soldering) the components 102 on a surface with high heat transport properties (for instance copper, graphene, aluminum nitride, etc.) which may be already pre-existent on a PCB/substrate.

Afterwards, the components 102 may be encapsulated, and the contacts of such components 102 may be exposed (for instance by via plasma etching of the dielectric material, or mechanical milling, etc.). Subsequently, via formation can be executed, followed then by via filling and structuring of a first layer. The mentioned first option considers that the subsequent layers for re-distribution can be manufactured either via wafer-level processing equipment or PCB/substrate processing equipment. On the other hand, the mentioned other option involves an assembly of such encapsulated components 102 directly on a known-good redistribution layer (for instance a PCB or a substrate).

Thereafter, the final assembly can be carried out. This process allows the realization of a component carrier 100 or system 150 according to an exemplary embodiment of the invention having the components 102 directly connected on the back on a heat dissipation layer allowing a fast heat transport away from the heat sensitive components 102.

FIG. 5 to FIG. 12 illustrate cross-sectional views of structures obtained during carrying out a method of manufacturing a component carrier 100 according to an exemplary embodiment of the invention.

Figure 5:
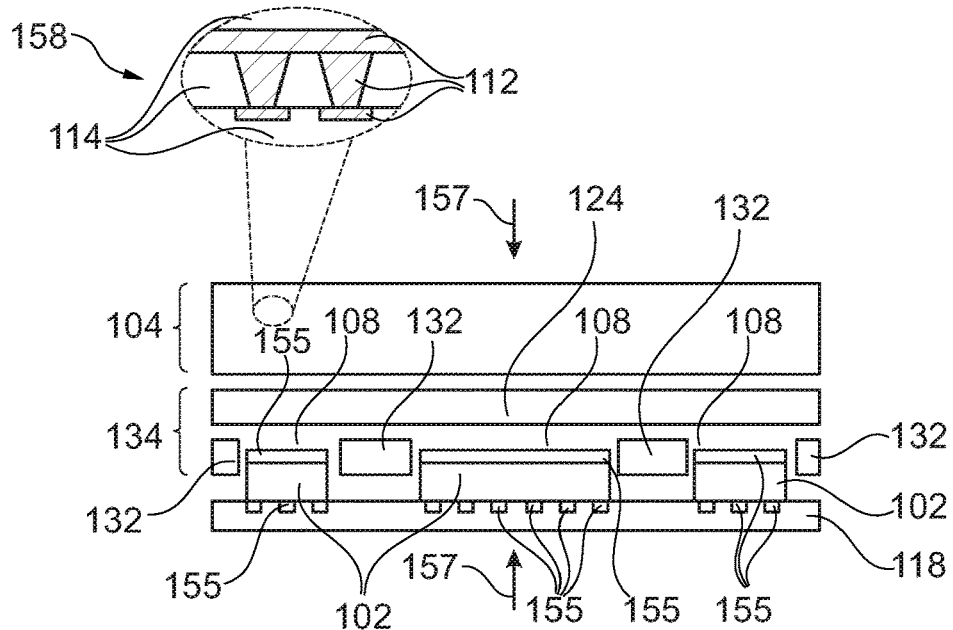
FIG. 5, FIG. 6, FIG. 7, FIG. 8, FIG. 9, FIG. 10, FIG. 11 and FIG. 12 illustrate cross-sectional views of structures obtained during carrying out a method of manufacturing a component carrier, shown in FIG. 12, according to an exemplary embodiment of the invention.

Referring to FIG. 5, a temporary carrier 118 (for instance a sticky plate or sticky tape or a core) is provided, and a number of components 102 (for instance semiconductor chips with pads 155) are attached to the temporary carrier 118. More generally, a temporary carrier may be in particular a disposable or re-usable substrate or plate having an adhesive layer on top. Constituents of intermediate layer structure 134 are arranged on top of the arrangement composed of temporary carrier 118 and components 102. In this embodiment, the constituents of intermediate layer structure 134 are a recessed layer 132 (which can be embodied as a pre-cut prepreg sheet) and a continuous electrically insulating layer structure 124 (which can be embodied as a continuous prepreg sheet). Both the recessed layer 132 and the electrically insulating layer structure 124 may be made of an uncured material (for instance B-stage material) which can be cured during lamination for connecting the constituents shown in FIG. 5. It is also possible to coalesce the recessed layer 132 and the electrically insulating layer structure 124 before curing in a so called soft-lamination process.

A first component carrier block 104, such as a cured PCB or IC substrate with optionally embedded components therein, is placed on top the described constituents.

Advantageously, the components 102 spaced with regard to first known-good component carrier block 104 by recessed layer 132 and layer structure 124 are known-good components 102, i.e. have been previously successfully tested concerning their mechanical and electrical functionality before carrying out the assembly process according to FIG. 5. Also the recessed layer 132 may be a known-good recessed layer 132 with known-good cavities 108 for accommodating the components 102. In other words, the recessed layer 132 and its cavities 108 have been successfully tested concerning their mechanical functionality before carrying out the assembly process according to FIG. 5. Correspondingly, also the first component carrier block 104 is a known-good first component carrier block 104 which has been successfully tested concerning its mechanical and electrical functionality before carrying out the assembly process according to FIG. 5.

In accordance with the qualification of the first component carrier block 104, the components 102 as well as the recessed layer 132 with its cavities 108 as known-good, they have each been tested for compliance with at least one respective quality criterion before the assembly process according to FIG. 5. They are classified as known-good only if the respectively tested constituent meets the at least one quality criterion, otherwise the respective constituent is rejected and is not used for the assembly process according to FIG. 5. Therefore, it can be avoided that only one or a few not good constituents render an entire manufactured component carrier 100 or system 150 non-usable. As a result, both manufacturing and hardware resources may be used efficiently.

As can be taken from a detail 158 in FIG. 5, the first component carrier block 104 is a fully cured PCB or IC substrate manufactured by laminating electrically conductive layer structures 112 (such as copper vias in combination with patterned copper foils) and electrically insulating layer structures 114 (such as epoxy resin sheets with reinforcing glass fibers or epoxy-based build-up films such as ABF) together by the application of pressure and/or heat. Thus, the first component carrier block 104 can be a cured PCB or IC substrate, or more generally, a cured layer stack. As previously described, this layer stack optionally may include one or more embedded components.

Figure 6:
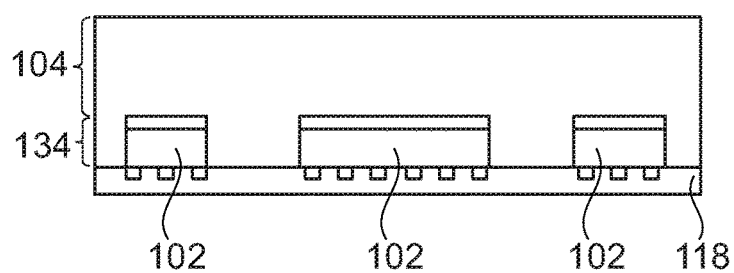

For connecting the constituents shown in FIG. 5 to obtain the structure shown in FIG. 6, the constituents are pressed together (see arrows 157) preferably accompanied by heat so that dielectric material of the previously uncured electrically insulating layer structure 124 and the previously uncured recessed layer 132 becomes temporarily flowable, starts cross-linking, and then resolidifies to thereby connect the first component carrier block 104, the intermediate layer structure 134 and the components 102 on the temporary carrier 118.

Figure 7:
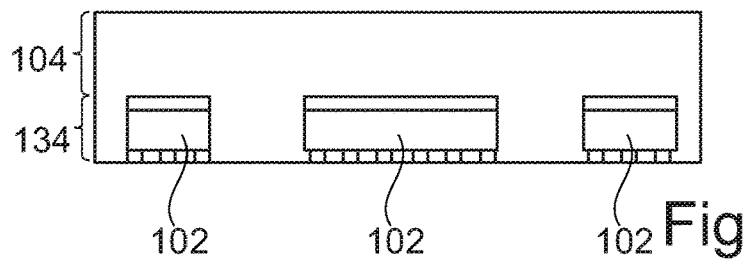

In order to obtain the structure shown in FIG. 7, the temporary carrier 118 is removed from the rest of the shown structure. In view of the curing and thereby hardening of the constituents of the intermediate layer structure 134, the temporary carrier 118 is no longer needed to provide mechanical support.

Figure 8:
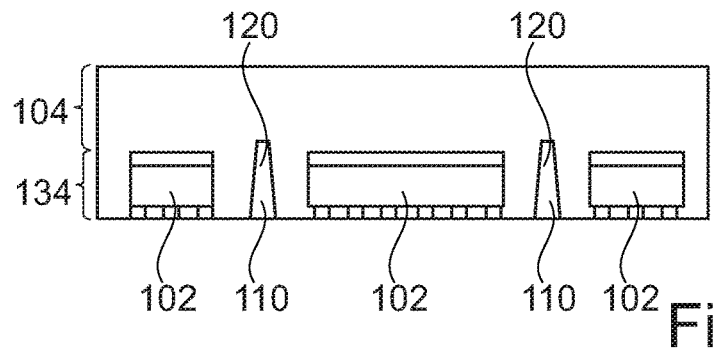

Referring to FIG. 8, a first part of an electrically conductive connection structure 110 is thereafter formed in the form of vertical interconnects 120 (here embodied as copper vias) extending through the intermediate layer structure 134 and into the first component carrier block 104. Thus, the vertical interconnects 120 may also be directly electrically coupled to the electrically conductive layer structure 112 of the first component carrier block 104 (see detail 158 in FIG. 5, not shown in FIG. 8). For example, the vertical interconnects 120 may be formed by firstly drilling laser holes by a laser into exposed surface portions of the intermediate layer structure 134 and extending up to or even into the first component carrier block 104. Thereafter, the laser holes may be partially or completely filled with copper material by plating. For avoidance of doubt, also other methods to form a hole to facilitate an electronic connection (for instance mechanical drilling) are possible.

Figure 9:
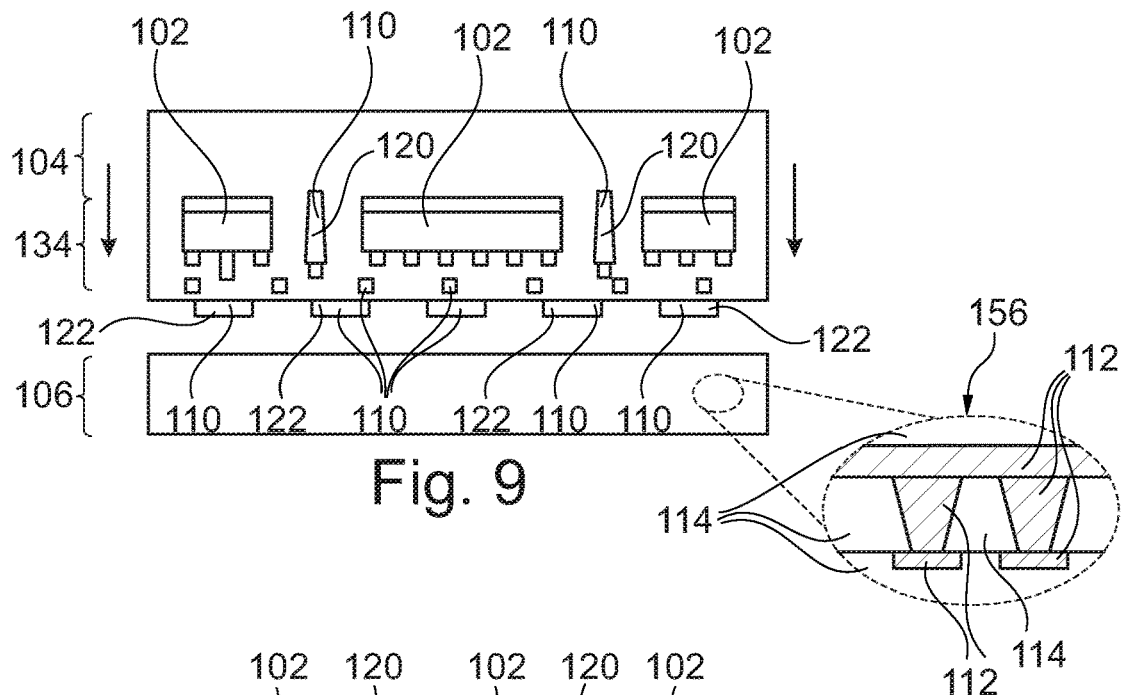

Referring to FIG. 9, the electrically conductive connection structure 110 may be completed by attaching and patterning an electrically conductive foil 122. The patterned electrically conductive foil 122 is directly electrically coupled with the vertical interconnects 120. Hence, the electrically conductive connection structure 110 composed of the vertical interconnects 120 and the patterned electrically conductive foil 122 together provide a three-dimensional electric coupling both within a horizontal plane according to FIG. 9 and perpendicular to this plane, i.e. along a horizontal direction according to FIG. 9. More precisely, the formation of the electrically conductive connection structure 110 also forms a component-external redistribution layer between the component 102 and a second component carrier block 106 to be subsequently connected. In other words, this redistribution layer of the electrically conductive connection structure 110 translates between the small dimensions of the chip world (i.e. the size of and distance between the pads 155 of the components 102) and the larger dimensions of the component carrier world (i.e. the size and distance between constituents of the electrically conductive connection structure 110 and the electrically conductive layer structures 112). An electrically conductive connection between the component 102 and the electrically conductive layer structures 112 of the first component carrier block 104 is accomplished by the electrically conductive connection structure 110.

Still referring to FIG. 9 and after completing formation of the electrically conductive connection structure 110, a second component carrier block 106 (such as a fully cured PCB or IC substrate which may have a composition as shown in detail 156 in FIG. 9 and optionally may include embedded components) may firstly be mechanically and electrically tested for compliance with at least one quality criterion concerning its intactness. As shown in detail 156, the second component carrier block 106 may be formed by laminating at least one electrically conductive layer structure 112 and at least one electrically insulating layer structure 114. As a result of the before mentioned test, the second component carrier block 106 may be classified as a known-good second component carrier block 106 if the second component carrier block 106 passes the test successfully. Otherwise, if the second component carrier block 106 fails to pass the test, it is rejected and is not used for the assembly process described in the following. In other words, the second component carrier block 106 is tested before being assembled with the other constituents shown in FIG. 9.

If the second component carrier block 106 has successfully passed the test, the components 102 are subsequently embedded between the first component carrier block 104 and the second component carrier block 106. This embedding is accomplished by attaching the second component carrier block 106 to the shown arrangement comprising the first component carrier block 104, the components 102 and the electrically conductive connection structure 110 as well as intermediate layer structure 134 (for instance with adhesive or further uncured material in between). The connection may be established by using technologies (in particular by a non-laminating technique) like mass reflow, copper-copper direct bonding, thermal compression bonding, soldering, any desired surface mount technology (such as direct chip attach, reflow soldering, use of an Anisotropic Conductive Film (ACF) or an Anisotropic Conductive Paste (ACP)). Other possibilities are ALIVH or $B^2iT$ or to add technologies for z-axis connections as package-to-board connection.

Figure 10:
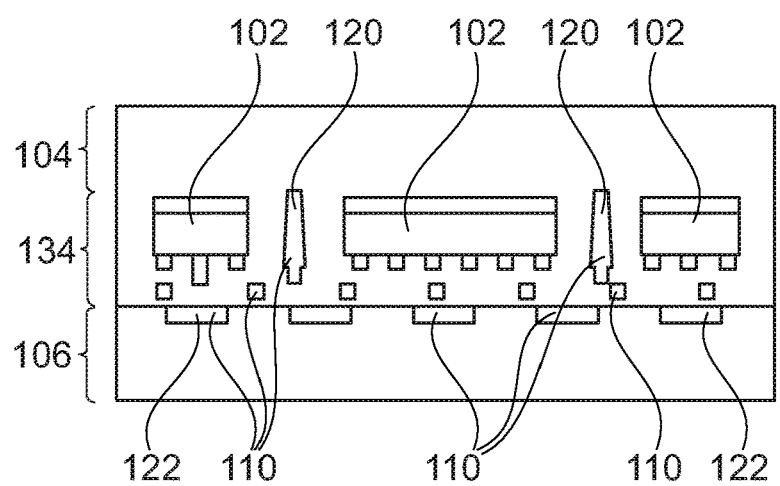

FIG. 10 shows the result of the previously described connection procedure.

Figure 11:
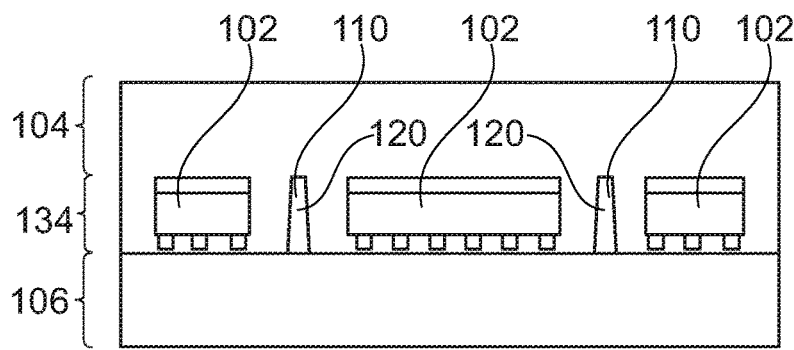

Referring to FIG. 11, an alternative structure is shown which is obtained by assembled the second known-good component carrier block 106 to the structure shown in FIG. 8. In this embodiment, a redistribution layer may already be formed as part of the components 102 or as part of second component carrier block 106.

Figure 12:
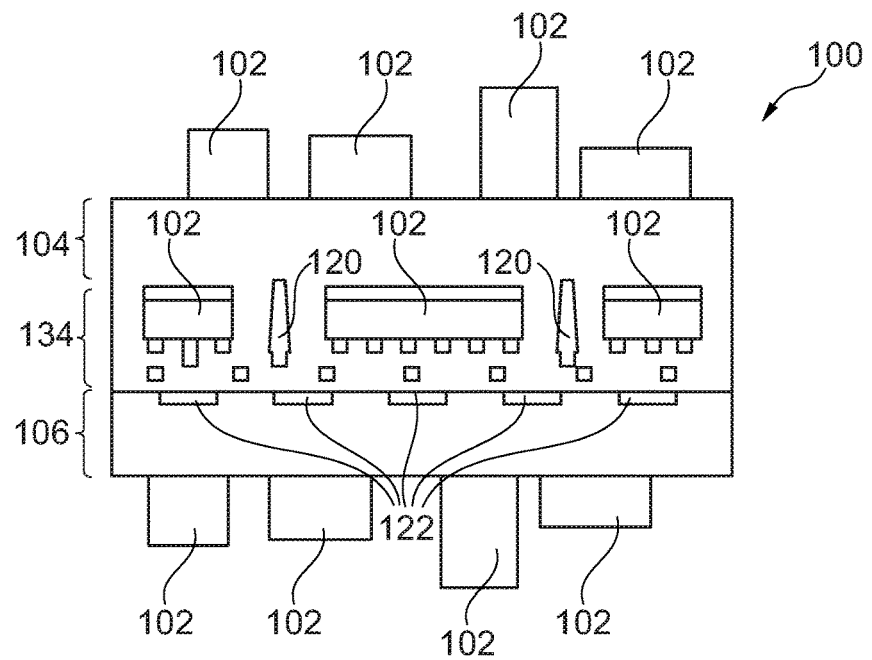

Referring to FIG. 12, a component carrier 100 according to an exemplary embodiment of the invention is shown which is obtained, based on the structure shown in FIG. 10, by surface mounting further components 102 (for instance semiconductor chips) on exposed electrically conductive layer structures 112 of the component carrier bodies 104, 106. A similar component carrier 100 may be obtained by a corresponding final assembly starting from the structure shown in FIG. 11.

FIG. 13 to FIG. 20 illustrate cross-sectional views of structures obtained during carrying out a method of manufacturing a component carrier 100 according to another exemplary embodiment of the invention.

Figure 13:
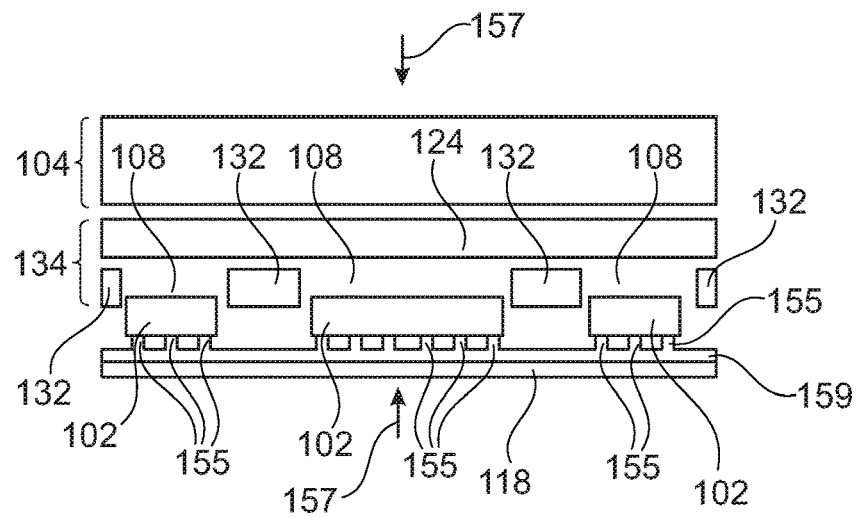
FIG. 13, FIG. 14, FIG. 15, FIG. 16, FIG. 17, FIG. 18, FIG. 19 and FIG. 20 illustrate cross-sectional views of structures obtained during carrying out a method of manufacturing a component carrier, shown in FIG. 20, according to another exemplary embodiment of the invention.

Referring to FIG. 13, and in comparison to FIG. 5, a metal foil 159 (in particular a copper foil) is interposed between the temporary carrier 118 and the components 102. Thus, the components 102 are bonded on the metal foil 159, for instance by thermal compression bonding (i.e. without material interface). The temporary carrier 118 which may also be denoted as a sacrificial carrier may hence have a copper surface and markers.

Figure 14:
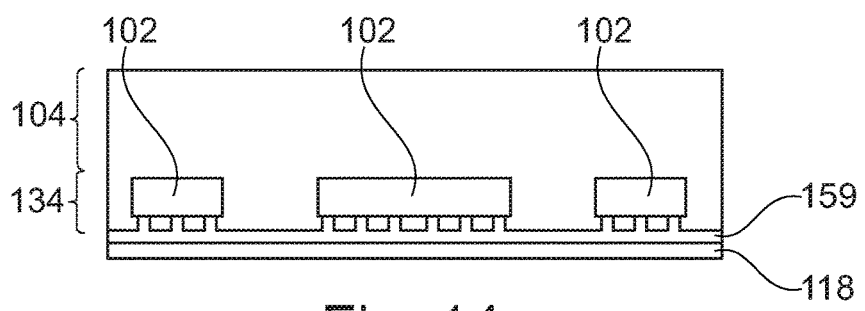

Referring to FIG. 14, the structure shown here is obtained by connecting the constituents according to FIG. 13 together.

Figure 15:
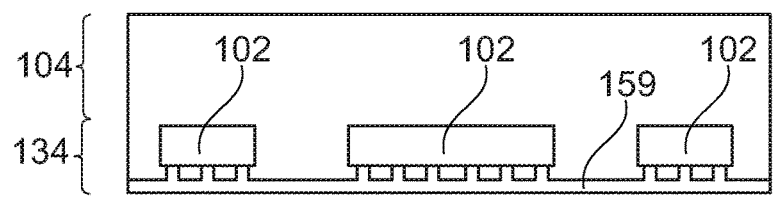

Referring to FIG. 15, the structure shown here is obtained by removing (in particular by peeling off) the temporary carrier 118.

Figure 16:
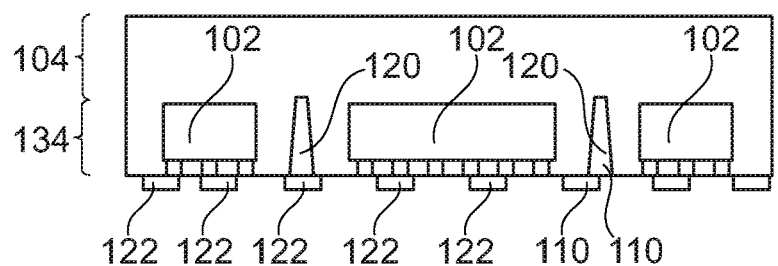

Referring to FIG. 16, vertical interconnects 120 are formed in the intermediate layer structure 134 and extend up to or even into the first component carrier block 104, as described above, so as to be electrically coupled with the electrically conductive layer structures 112 of the first component carrier block 104. A further constituent of the electrically conductive connection structure 110 shown in FIG. 16 is a patterned electrically conductive foil 122.

Figure 17:
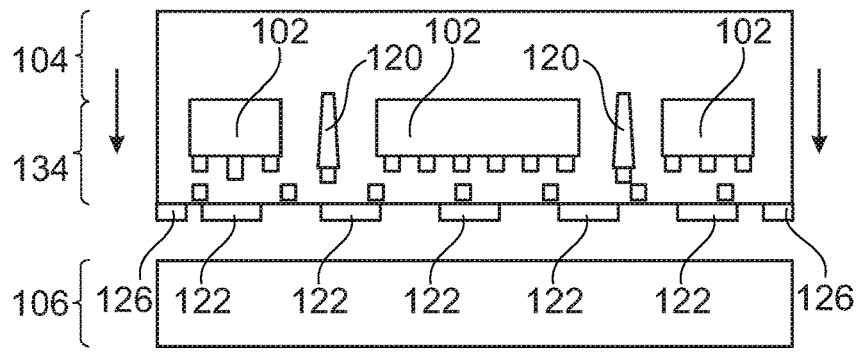

Referring to FIG. 17, further layer structures are built on a bottom of the intermediate layer structure 134 to provide a redistribution layer (RDL) for electrically connecting the carrier body 106. A further insulating layer 126 is applied on the bottom of the further layer structure to receive a hermetically sealed connection to the carrier body 106. The carrier body 106 is tested before assembling as described above, and is attached to the structure shown in FIG. 16 from a bottom side.

Figure 18:
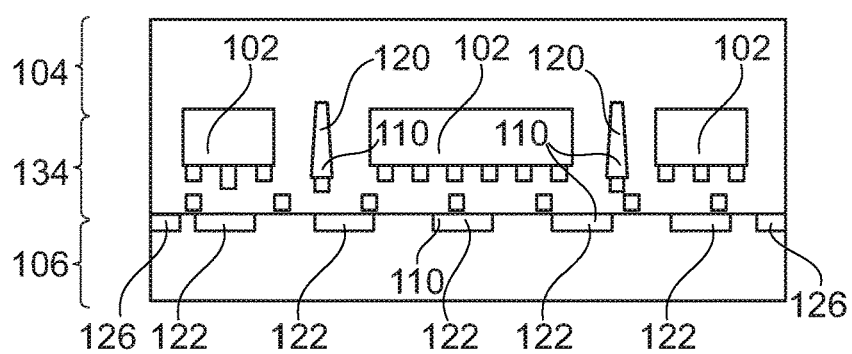

FIG. 18 shows the result of a connection of the second component carrier body 106 with the interconnected arrangement of first component carrier body 104, intermediate layer structure 134, components 102 and electrically conductive connection structure 110. Adhesive or uncured material may be provided in between to promote the connection of the constituents to form an integral body.

Figure 19:
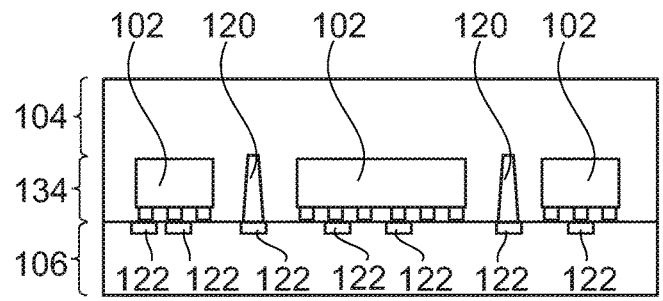

Referring to FIG. 19, an alternative structure is shown which is obtained by assembling the second known-good component carrier block 106 to a structure similar to the one shown in FIG. 16. In this embodiment, a redistribution layer may already be formed as part of the components 102 and/or the second component carrier block 106.

Figure 20:
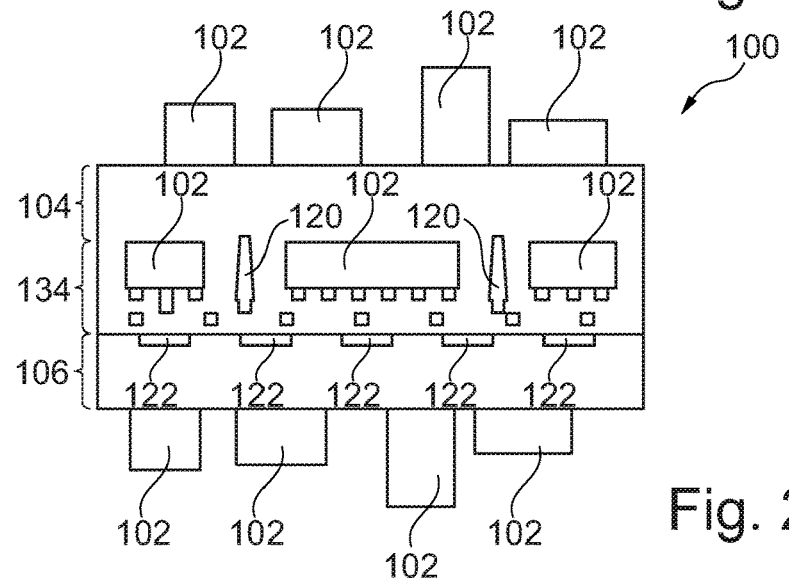

Referring to FIG. 20, a component carrier 100 according to an exemplary embodiment of the invention is shown which is obtained, based on the structure shown in FIG. 18, by surface mounting further components 102 (for instance semiconductor chips) on exposed electrically conductive layer structures 112 of the component carrier bodies 104, 106. A similar component carrier 100 may be obtained by a corresponding final assembly starting from the structure shown in FIG. 19.

FIG. 21 to FIG. 27 illustrate cross-sectional views of structures obtained during carrying out a method of manufacturing a component carrier 100 according to still another exemplary embodiment of the invention.

Figure 21:
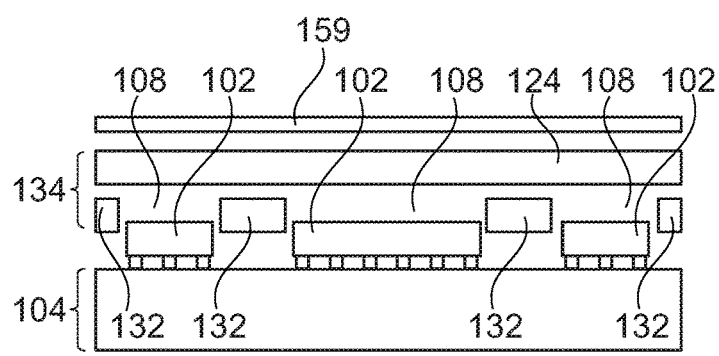
FIG. 21, FIG. 22, FIG. 23, FIG. 24, FIG. 25, FIG. 26 and FIG. 27 illustrate cross-sectional views of structures obtained during carrying out a method of manufacturing a component carrier, shown in FIG. 27, according to still another exemplary embodiment of the invention.

Referring to FIG. 21, a plurality of known-good components 102 (which have been successfully tested concerning at least one quality criterion before assembly) are mounted directly on a fully cured first known-good component carrier body 104 (which has been successfully tested concerning at least one quality criterion before assembly), for instance a PCB or an IC substrate. An uncured recessed layer 132 defining known-good cavities 108 (which have been successfully tested concerning at least one quality criterion before assembly) and an uncured complete electrically insulating layer structure 124, both made of uncured material such as B-state prepreg, are attached (optionally after soft-lamination) from above so that the components 102 are located in the cavities 108 and are covered by the electrically insulating layer structure 124 from above. A metal layer 159 (for instance a copper foil) is attached to an upper main surface of the uncured or soft-laminated complete electrically insulating layer structure 124.

Figure 22:
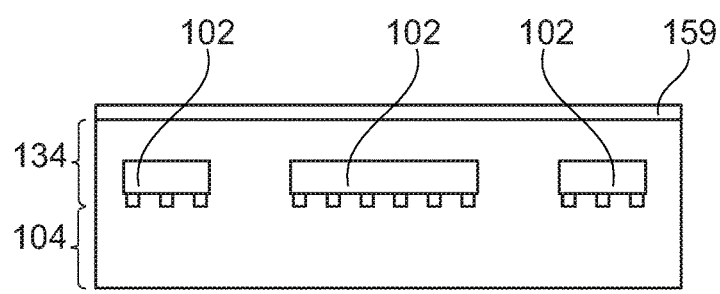

In order to obtain the structure shown in FIG. 22, the constituents described referring to FIG. 21 are connected with one another by lamination, i.e. the application of pressure and/or heat, so that the uncured material of constituents 124, 132 adhesively connect these constituents together.

Figure 23:
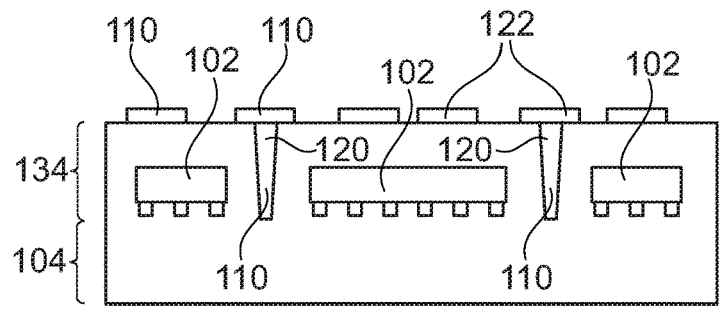

As shown in FIG. 23, electrically conductive connection structure 110 is formed for electrically connecting the first component carrier body 104 through intermediate layer 134 which is composed of cured material of previously uncured constituents 124, 132. As described above, the electrically conductive connection structure 110 comprises vertical interconnects 120 (in particular copper filled laser vias) and patterned electrically conductive foil 122.

Figure 24:
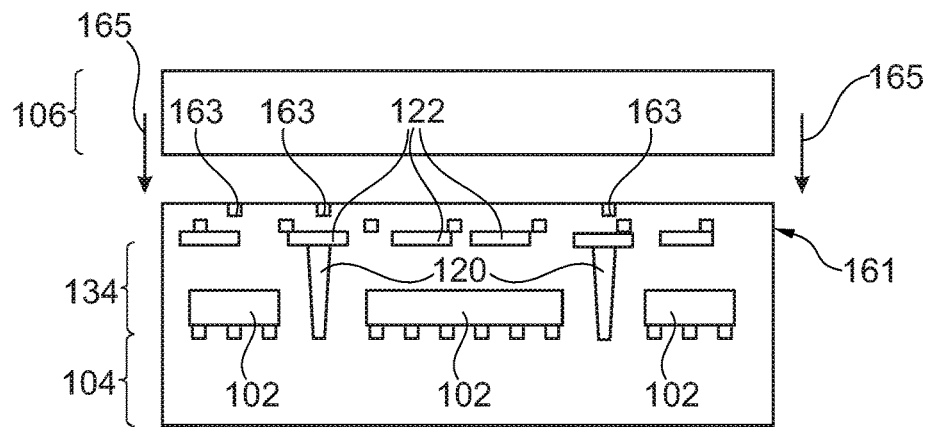

In order to obtain the structure shown in FIG. 24, further layer structures may be built to an upper main surface of the structure shown in FIG. 23. Constituents 161, 163 may be used for building a component-external redistribution layer. Thereafter, a fully cured second known-good component carrier body 106 (which has been successfully tested concerning at least one quality criterion before assembly), for instance a PCB or an IC substrate which optionally may include embedded components (not shown), is added from above (see arrows 165).

Figure 25:
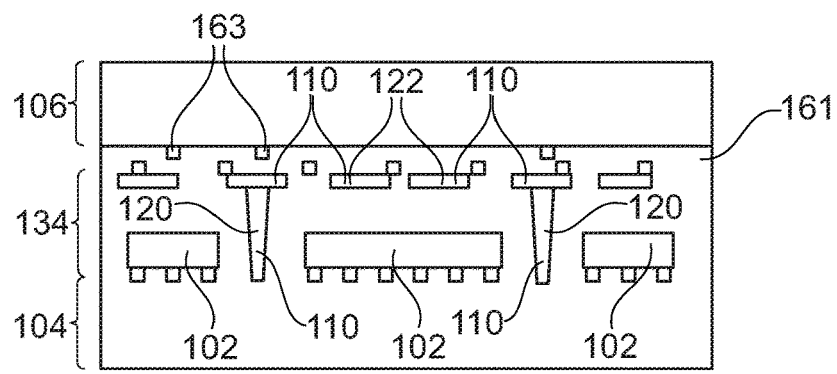

In order to obtain the structure shown in FIG. 25, the constituents described referring to FIG. 24 are connected using technologies (in particular a non-laminating technique) like mass reflow, copper-copper direct bonding, thermal compression bonding, soldering, any desired surface mount technology (such as direct chip attach, reflow soldering, use of an Anisotropic Conductive Film (ACF) or an Anisotropic Conductive Paste (ACP)). One other possibility is to add technologies for z-axis connections as package-to-board connection.

FIG. 25 shows the result of an assembly of the second component carrier body 106 through the interconnected arrangement of first component carrier body 104, intermediate layer structure 134, components 102 and electrically conductive connection structure 110.

Figure 26:
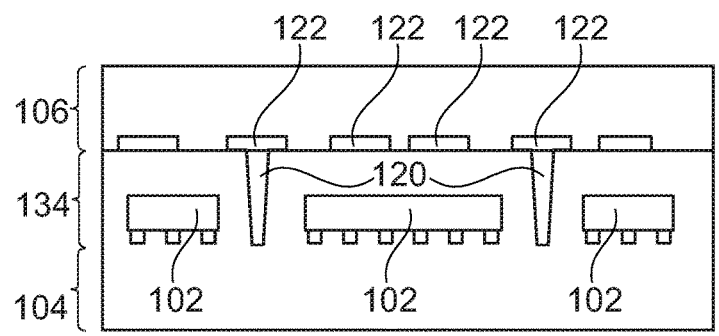

Referring to FIG. 26, an alternative structure is shown which is obtained by assembling the second known-good component carrier block 106 to a structure similar to the one shown in FIG. 23. In this embodiment, a redistribution layer may already be formed as part of the components 102 and/or as part of the second component carrier body 106.

Figure 27:
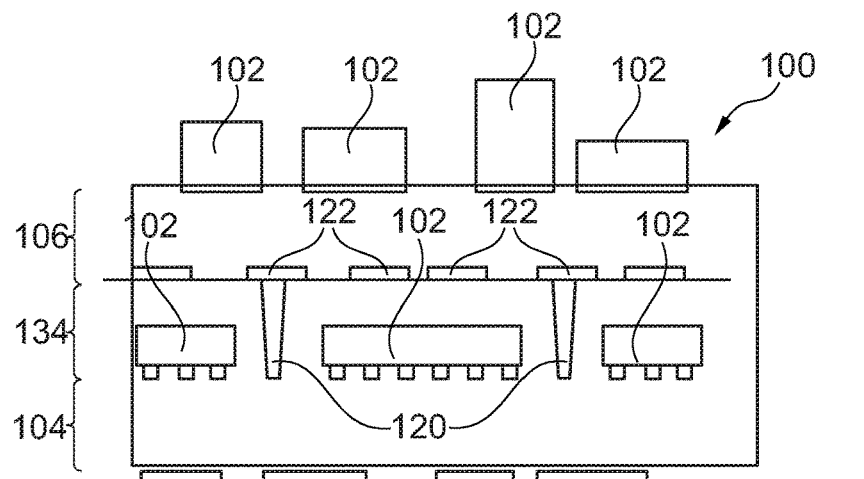

Referring to FIG. 27, a component carrier 100 according to an exemplary embodiment of the invention is shown which is obtained, based on the structure shown in FIG. 26, by surface mounting further components 102 (for instance semiconductor chips) on exposed electrically conductive layer structures 112 (not shown in FIG. 27) of the component carrier bodies 104, 106. A similar component carrier 100 may be obtained by a corresponding final assembly starting from the structure shown in FIG. 25.

FIG. 28 to FIG. 34 illustrate cross-sectional views of structures obtained during carrying out a method of manufacturing a component carrier 100 according to still another exemplary embodiment of the invention.

Figure 28:
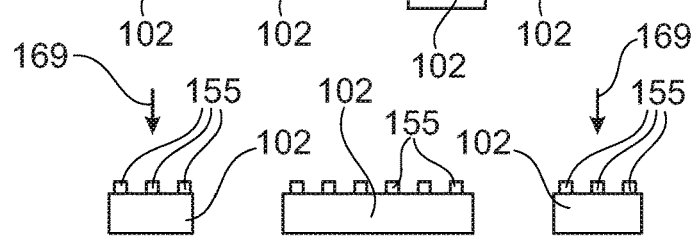
FIG. 28, FIG. 29, FIG. 30, FIG. 31, FIG. 32, FIG. 33 and FIG. 34 illustrate cross-sectional views of structures obtained during carrying out a method of manufacturing a component carrier according to still another exemplary embodiment of the invention.

Referring to FIG. 28, a plurality of known-good components 102 (which have been successfully tested concerning at least one quality criterion before assembly) are mounted (see arrows 169) on a fully cured first known-good component carrier body 104 (which has been successfully tested concerning at least one quality criterion before assembly), for instance a PCB or an IC substrate. Such a known-good component carrier body 104 may possess on its surface, metal areas (for instance structured copper) forming component contacts 167 each of which being aligned with a respective one of the components 102. The components 102 are attached face up, i.e. with pads 155 facing away from the component contacts 167.

Figure 29:
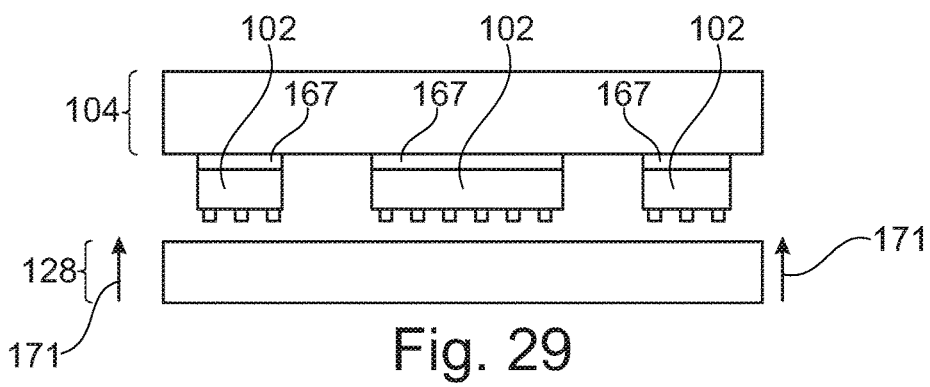

Referring to FIG. 29, the structure obtained from the procedure described referring to FIG. 28 is flipped upside down, and an encapsulant 128 (for instance a mold compound or a laminate which optionally may include cavities (not shown) for accommodating the components 102) is added (see arrows 171). Hence, the described embodiment includes the procedure of encapsulating the components 102 by encapsulant 128 on the first component carrier block 104 prior to connecting a second component carrier block 106 (compare FIG. 32) to the partially encapsulated components 102.

Figure 30:
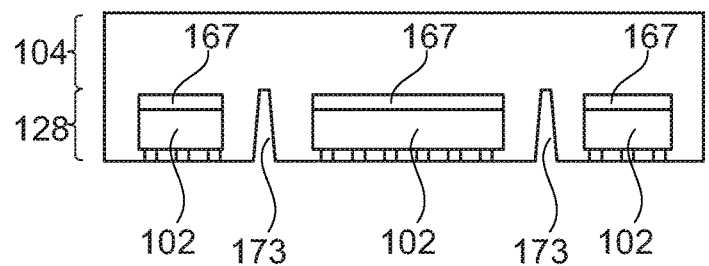

Referring to FIG. 30, the hardened encapsulant 128 fills gaps between adjacent components 102. Blind hole-type recesses 173 are then formed (for instance by laser drilling or mechanically drilling) in exposed main surface portions of the encapsulant 128. By these recesses 173, electrically conductive layer structures 112 (not shown in FIG. 30) of the first component carrier body 104 are exposed to be subsequently contacted. Also the pads 155 are exposed to be subsequently contacted.

Figure 31:
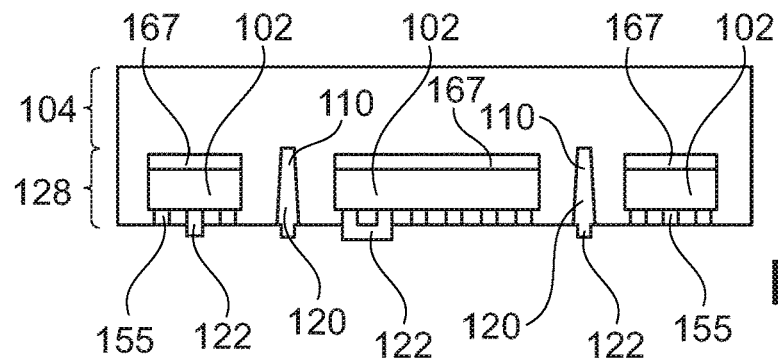

Referring to FIG. 31, part of electrically conductive connection structure 110 is formed by filling the recesses 173 with electrically conductive material (for instance by copper plating) to thereby form vertical interconnects 120. Also, a patterned electrically conductive foil 122 is formed at a lower main surface of the structure according to FIG. 30 to form also part of the electrically conductive connection structure 110. Thus, a via filling and first layer structuring procedure may be carried out.

Figure 32:
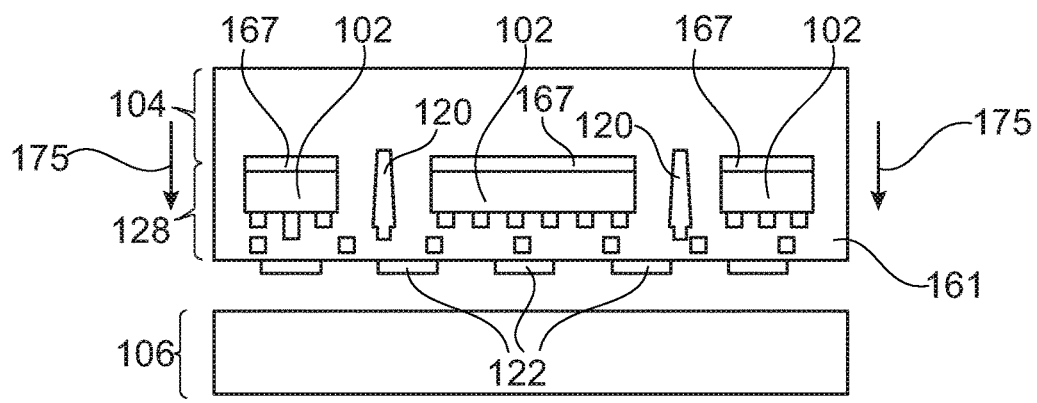

Referring to FIG. 32, further layer structures are built on a bottom of the encapsulant 128 to provide an RDL-structure. This may prepare a subsequent assembly of the described arrangement on a fully cured second known-good component carrier body 106 (which has been successfully tested concerning at least one quality criterion before assembly), for instance a PCB or an IC substrate which is added from below (see arrows 175).

Figure 33:
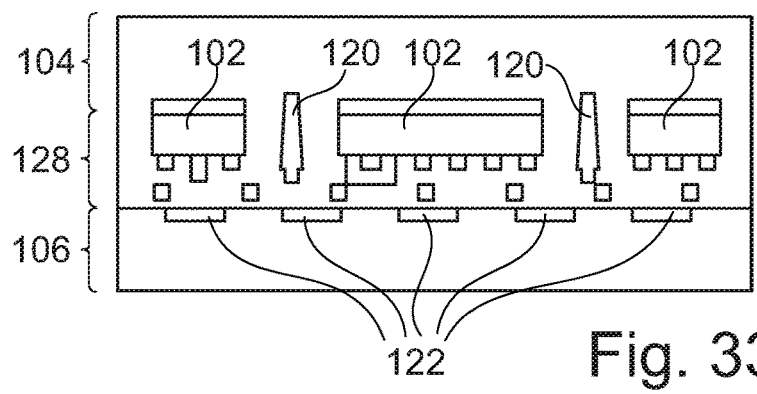

In order to obtain the structure shown in FIG. 33, the constituents described referring to FIG. 32 are connected with one another as described above.

Figure 34:
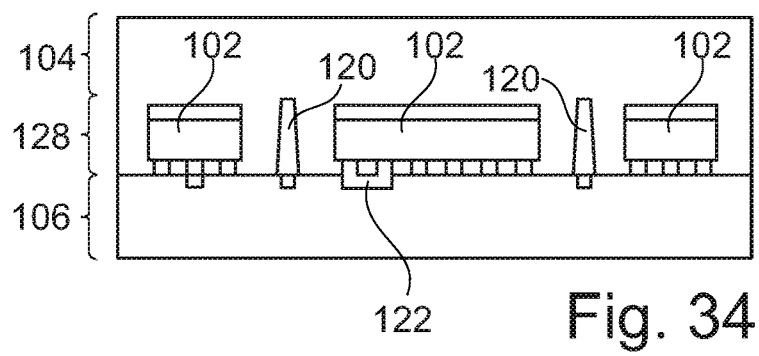

Referring to FIG. 34, an alternative structure is shown which is obtained by mounting the second known-good component carrier block 106 to a structure similar to the one shown in FIG. 33. In this embodiment, a redistribution layer may however already be formed as part of the components 102 and/or as part of the second component carrier body 106.

Thereafter, one or more further components 102 may be surface mounted on the so obtained structure (not shown).

In FIG. 35, a system 150 according to an exemplary embodiment of the invention is shown.

The system 150 is composed of two stacked and assembled known-good component carriers 100 manufactured as described above on top of one another. In particular, it is advantageous to assemble system 150 based on a plurality of component carriers 100 each of which being individually classified as known-good component carrier 100. Highly advantageously, the system 150 is manufactured by electrically connecting the individual known-good component carriers 100 without interface between different materials, which can be obtained by thermal compression bonding (see reference numeral 167).

For manufacturing the system 150, the two known-good component carriers 100 are vertically interconnected. Each of the components 100 is composed of known-good component carrier blocks 104, 106, and comprises a respective electrically conductive connection structure 110 formed at least partially after mounting the components 102 in the cavities 108 (not shown in FIG. 35).

The system 150 can then be obtained by mounting the upper known-good component 100 on the lower known-good component 100, whereby a direct copper-copper interconnection may be established. More precisely, electromechanical connection 167 may be established between copper surface structures of the component carriers 100. By carrying out such a connection technique, it is possible to form the three-dimensionally integrated system 150 according to an exemplary embodiment of the invention shown in FIG. 35.

In order to increase the yield it is preferable to re-combine separately manufactured and electrically tested modules (i.e. known-good modules) or component carriers 100. The re-combination of these known-good modules or component carriers 100 can be executed with technologies such as mass reflow, copper-copper direct bonding, thermal compression bonding, etc. as shown in FIG. 35.

Figure 36:
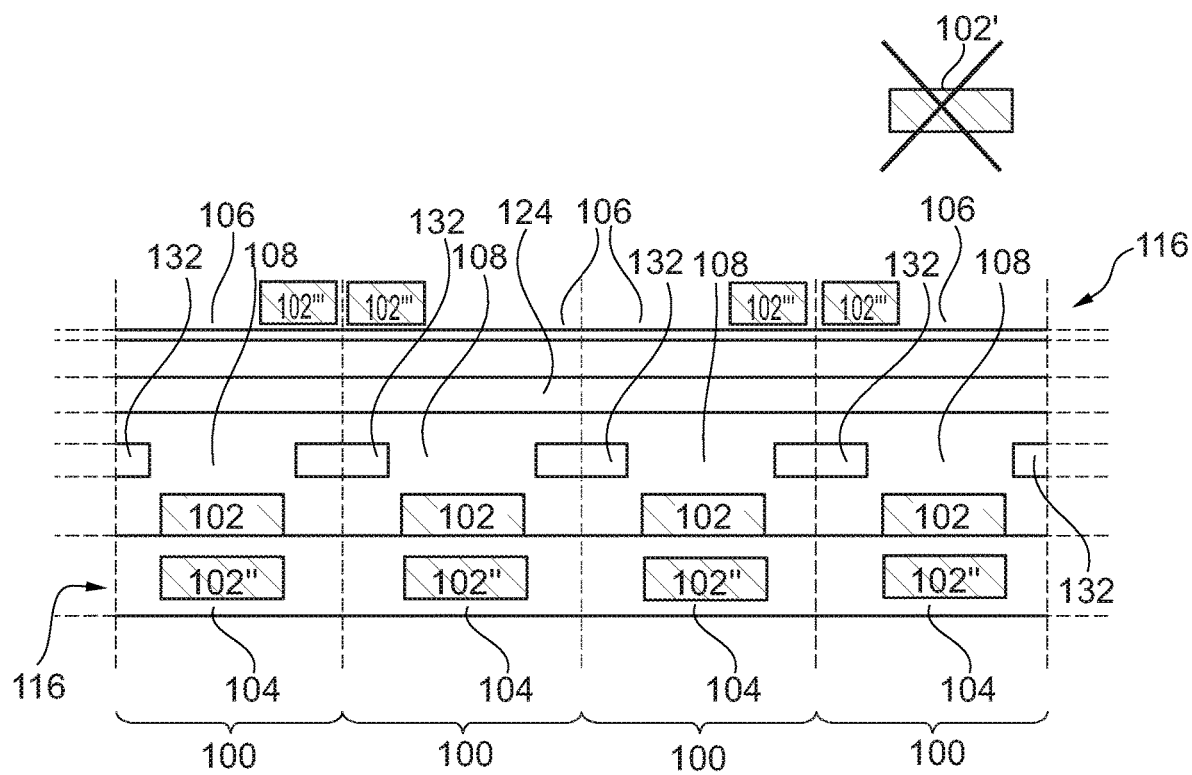
FIG. 36 illustrates a cross-sectional view of a structure obtained during carrying out a method of manufacturing component carriers in a batch procedure on panel level according to an exemplary embodiment of the invention.

FIG. 36 illustrates a cross-sectional view of a structure obtained during carrying out a method of manufacturing component carriers 100 in a batch procedure on panel level according to an exemplary embodiment of the invention.

In particular, FIG. 36 shows that a plurality of component carriers 100 may be formed simultaneously on panel level, i.e. on a common panel 116 (for instance having a size of 18×24 inches$^2$ or 510×550 mm$^2$). For example, such a panel may have a size in a range between 200×200 mm$^2$ up to 600×600 mm$^2$, or even higher. Neighbouring sections of the still integral panel 116 constitute first known-good component carrier bodies 104 on which known-good components 102 are mounted. Above-described constituents 132, 124 with known-good cavities 108 may be attached from above and may be laminated together with a further panel 116 comprising a plurality of still integrally connected second known-good component carrier blocks 106. Although not shown in FIG. 36, electrically conductive connection structures 110 may be formed after attaching the components 102 on the first component carrier bodies 104 of lower panel 116 and before attaching the second component carrier bodies 106 of upper panel 116.

A component 102' has failed to pass the quality test, is hence not classified as known-good component 102 and is therefore not used for the manufacturing of component carriers 100.

After completion of the formation of the still integrally connected component carriers 100 on panel level according to FIG. 36, the so obtained structure including panels 116,

116 may be singularized (for instance by laser processing, etching or mechanically sawing) to thereby form a plurality of separate component carriers 100.

FIG. 36 shows that each of the first component carrier block 104 contains an embedded component 102". Correspondingly, each of the second component carrier block 106 contains an embedded component 102'''.

The following aspects of embodiments of the invention are disclosed:

Aspect 1. A method of manufacturing a component carrier, comprises the steps of mounting a known-good component on or spaced with regard to a first known-good component carrier block; thereafter forming an electrically conductive connection structure on and/or in and/or spaced with regard to the first component carrier block; embedding the component between the first component carrier block and a second known-good component carrier block.

Aspect 2. The method according to aspect 1, wherein the method further comprises providing at least one of the first component carrier block and the second component carrier block or at least one recessed layer in between with a cavity, in particular a known-good cavity; and mounting the component in the cavity.

Aspect 3. The method according to aspect 1 or 2, wherein the method comprises stacking a plurality of known-good component carriers manufactured according to aspect 1 or 2 on top of one another.

Aspect 4. The method according to any of aspects 1 to 3, wherein the method comprises, prior to the mounting: testing, in particular electrically testing, the first component carrier block, the second component carrier block and the component for compliance with at least one quality criterion; and classifying the first component carrier block, the second component carrier block, and the component as a known-good first component carrier block, a known-good second component carrier block, and a known-good component), respectively, only if the tested first component carrier block, second component carrier block, and component, respectively, meets the at least one quality criterion, otherwise rejecting the tested first component carrier block, second component carrier block, and component, respectively.

Aspect 5. The method according to any of aspects 1 to 4, wherein the method comprises forming the electrically conductive connection structure so as to establish an electrically conductive coupling between at least two of the group consisting of the first component carrier block, the second component carrier block, and the component by the electrically conductive connection structure.

Aspect 6. The method according to any of aspects 1 to 5, wherein the method comprises forming at least one of the first component carrier block and the second component carrier block by connecting, in particular by laminating, at least one electrically conductive layer structure and at least one electrically insulating layer structure.

Aspect 7. The method according to any of aspects 1 to 6, wherein the method comprises forming the electrically conductive connection structure for providing an electric coupling both within a plane corresponding to a respective layer of the component carrier blocks and perpendicular to the plane.

Aspect 8. The method according to any of aspects 1 to 7, wherein the method comprises forming a plurality of component carriers according to any of aspects 1 to 7 simultaneously on a panel; and subsequently singularizing the panel to thereby form the plurality of separate component carriers.

Aspect 9. The method according to aspect 8, wherein the method comprises: testing on panel level, in particular electrically testing, a first common component carrier block, a second common component carrier block, and a plurality of components for compliance with at least one quality criterion; and classifying the first common component carrier block, the second common component carrier block, and the individual components as a known-good first common component carrier block, a known-good second common component carrier block, and a known-good component, respectively, only if the tested first common component carrier block, second common component carrier block, and respective component, respectively, meets at least one quality criterion, otherwise not using the tested first common component carrier block, second common component carrier block, and respective component, respectively, for manufacturing the component carriers.

Aspect 10. The method according to any of aspects 1 to 9, wherein the method further comprises: testing, in particular electrically testing, a plurality of component carriers manufactured according to any of aspects 1 to 9; and classifying a respective one of the component carriers as known-good component carrier only if the tested respective component carrier meets the at least one quality criterion, otherwise rejecting the respective component carrier; thereafter assembling a system composed of a plurality of component carriers which have been classified before as known-good component carriers.

Aspect 11. The method according to any of aspects 1 to 10, wherein at least one of the first component carrier block and the second component carrier block comprises or consists of fully cured material at the time of mounting the component.

Aspect 12. The method according to any of aspects 1 to 11, wherein the method comprises electrically connecting at least two of the first component carrier block, the second component carrier block, and the component by the electrically conductive connection structure without interface between different materials, in particular by thermal compression bonding.

Aspect 13. The method according to any of aspects 1 to 12, wherein the method comprises surface mounting at least one further component, in particular at least one further known-good component, on an exterior main surface of the component carrier, in particular on an exterior main surface of at least one of the first component carrier block and the second component carrier block.

Aspect 14. The method according to any of aspects 1 to 13, wherein mounting the component on or spaced with regard to the first component carrier block comprises arranging the component on a temporary carrier, thereafter laminating the first component carrier block with the component on the temporary carrier, and subsequently removing the temporary carrier.

Aspect 15. The method according to any of aspects 1 to 14, wherein forming the electrically conductive connection structure comprises forming at least one vertical interconnect, in particular at least one copper filled laser via.

Aspect 16. The method according to any of aspects 1 to 15, wherein forming the electrically conductive connection structure comprises attaching and patterning an electrically conductive foil.

Aspect 17. The method according to any of aspects 1 to 16, wherein embedding comprises attaching the second component carrier block to an arrangement comprising the first component carrier block, the component and the electrically conductive connection structure.

Aspect 18. The method according to any of aspects 1 to 17, wherein forming the electrically conductive connection structure comprises forming a component-external redistribution layer between the component and the second component carrier block.

Aspect 19. The method according to any of aspects 1 to 18, wherein the method comprises forming an electrically conductive connection between the component and the first component carrier block by the electrically conductive connection structure.

Aspect 20. The method according to any of aspects 1 to 19, wherein the method comprises: providing at least one at least partially uncured electrically insulating layer structure between the first component carrier block and the second component carrier block; and curing the at least one at least partially uncured electrically insulating layer structure to thereby establish an integral connection between the first component carrier block and the second component carrier block.

Aspect 21. The method according to any of aspects 1 to 20, wherein the method comprises mounting the component directly on the first component carrier block or indirectly via at least one intermediate layer structure on the first component carrier block.

Aspect 22. The method according to any of aspects 1 to 21, wherein the method comprises at least partially encapsulating the component by an encapsulant on the first component carrier block prior to connecting the second component carrier block to the encapsulated component.

Aspect 23. The method according to any of aspects 1 to 22, wherein the method providing an intermediate layer structure at least partially accommodating the component and arranged between the first component carrier block and the second component carrier block.

Aspect 24. A method of manufacturing a system, wherein the method comprises: manufacturing a plurality of component carriers by a method according to any of aspects 1 to 22; testing as to whether the individual component carriers meet at least one predefined quality criterion, so that the respective component carrier is classified as known-good component carrier, or is not classified as known-good component carrier; assembling, in particular stacking, a plurality of component carriers which have been classified as known-good component carriers to form the system.

Aspect 25. A component carrier, wherein the component carrier comprises: a first known-good component carrier block; a known-good component mounted on or spaced with regard to the first component carrier block; an electrically conductive connection structure formed on and/or in and/or spaced with regard to the first component carrier block after the mounting; a second known-good component carrier block, wherein the component is embedded between the first component carrier block and the second component carrier block.

Aspect 26. The component carrier according to aspect 25, comprising a redistribution layer structure, in particular at least partially formed by the electrically conductive connection structure, which electrically connects the known-good component and the second component carrier block and/or the first component carrier block.

Aspect 27. The component carrier according to aspect 25 or 26, wherein the second component carrier block and/or the first component carrier block contains one or more embedded components.

Aspect 28. The component carrier according to aspect 25 to 27, wherein a connection of the first component carrier block and/or the second component carrier block, in particular to an intermediate layer structure, is hermetically sealed, in particular by an insulating layer.

Aspect 29. The component carrier according to any of aspects 25 to 28, comprising at least one of the following features: the component carrier, in particular at least one of the first component carrier block and the second component carrier block, comprises at least one electrically conductive layer structure, in particular comprising at least one of the group consisting of copper, aluminum, nickel, silver, gold, palladium, and tungsten, any of the mentioned materials being optionally coated with supra-conductive material such as graphene; the component carrier, in particular at least one of the first component carrier block and the second component carrier block, comprises at least one electrically insulating layer structure, in particular comprising at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide; wherein the component is selected from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a light guiding element, a further component carrier and a logic chip; the component carrier is shaped as a plate; the component carrier is configured as one of the group consisting of a printed circuit board, and a substrate.

Aspect 30. A system, wherein the system comprises a plurality of assembled, in particular stacked, known-good component carriers according to any of aspects 25 to 29.

It should be noted that the term "comprising" does not exclude other elements or steps and the article "a" or "an" does not exclude a plurality. Also, elements described in association with different embodiments may be combined.

It should also be noted that reference signs in the claims shall not be construed as limiting the scope of the claims.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:
1. A semifinished component carrier, comprising:
a first known-good component carrier block;
a known-good component mounted on or spaced with regard to the first component carrier block;
an electrically conductive connection structure formed at least one of on, in and spaced with regard to the first component carrier block;
a second known-good component carrier block, wherein the known-good component is embedded within at least one of the first known-good component carrier block and the second known-good component carrier block, wherein the known-good first component carrier block, the known-good second component carrier block, and the known-good component, respectively, meets at least one quality criterion; and an intermediate layer structure, wherein the intermediate layer structure at least partially accommodates the known-good component, is arranged between the known-good first component carrier block and the known-good second component carrier block, and is at least one at least partially uncured electrically insulating layer structure.

2. The semifinished component carrier according to claim 1, wherein the known-good first component carrier block, the known-good second component carrier block and the known-good component are configured to be tested for compliance with the at least one quality criterion without being mounted to the first known good component carrier block.

3. The semifinished component carrier according to claim 1, wherein the electrically conductive connection structure electrically couples at least two of the group consisting of the first known-good component carrier block, the second known-good component carrier block, and the known-good component.

4. The semifinished component carrier according to claim 1, wherein at least one of the first known-good component carrier block and the second known-good component carrier block is a laminate made of at least one electrically conductive layer structure and at least one electrically insulating layer structure.

5. The semifinished component carrier according to claim 1, wherein the electrically conductive connection structure is configured for providing an electric coupling both within the plane corresponding to a respective layer of the component carrier blocks and perpendicular to the plane.

6. The semifinished component carrier according to claim 1, wherein at least one of the first component carrier block and the second component carrier block comprises of fully cured material.

7. The semifinished component carrier according to claim 1, wherein the electrically conductive connection structure forms at least one vertical interconnect, in particular at least one copper filled laser via.

8. The semifinished component carrier according to claim 1, wherein the electrically conductive connection structure comprises a patterned electrically conductive foil.

9. The semifinished component carrier according to claim 1, further comprising:
a redistribution layer structure which electrically connects the known-good component and at least one of the second component carrier block and the first component carrier block.

10. The semifinished component carrier according to claim 9, wherein the redistribution layer structure is at least partially formed by the electrically conductive connection structure.

11. The semifinished component carrier according to claim 1, wherein at least one of the second component carrier block and the first component carrier block contains one or more embedded components.

12. The semifinished component carrier according to claim 1, wherein the component is mounted directly on the first component carrier block or indirectly via at least one intermediate layer structure on the first component carrier block.

13. The semifinished component carrier according to claim 1, wherein a connection of at least one of the first component carrier block and the second component carrier block to an intermediate layer structure is hermetically sealed.

14. The semifinished component carrier according to claim 13, wherein the connection is hermetically sealed by an insulating layer.

15. The semifinished component carrier according to claim 1, further comprising at least one of the following features:
at least one of the first component carrier block and the second component carrier block comprises at least one electrically conductive layer structure comprising at least one of the group consisting of copper, aluminum, nickel, silver, gold, palladium, and tungsten, any of the mentioned materials being optionally coated with supra-conductive material such as graphene;
at least one of the first component carrier block and the second component carrier block comprises at least one electrically insulating layer structure comprising at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;
wherein the component is selected from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a light guiding element, a further component carrier and a logic chip;
the component carrier is shaped as a plate;
the component carrier is configured as one of the group consisting of a printed circuit board, and a substrate.

16. The semifinished component carrier according to claim 1, further comprising:
at least one further component, in particular at least one further known-good component, on an exterior main surface of the component carrier, in particular on an exterior main surface of at least one of the first component carrier block and the second component carrier block.

* * * * *